United States Patent
Kajigaya

(10) Patent No.: US 7,830,739 B2
(45) Date of Patent: Nov. 9, 2010

(54) SEMICONDUCTOR MEMORY DEVICE

(75) Inventor: Kazuhiko Kajigaya, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/457,962

(22) Filed: Jun. 26, 2009

(65) Prior Publication Data

US 2009/0268537 A1    Oct. 29, 2009

Related U.S. Application Data

(62) Division of application No. 11/882,827, filed on Aug. 6, 2007, now Pat. No. 7,573,767.

(30) Foreign Application Priority Data

Aug. 9, 2006    (JP)    ............................. 2006-217575

(51) Int. Cl.
    *G11C 7/02*    (2006.01)
(52) U.S. Cl. ........................................ 365/207; 365/49
(58) Field of Classification Search ................. 365/207, 365/49.1, 230.03
    See application file for complete search history.

(56) References Cited

U.S. PATENT DOCUMENTS

| 5,325,329 | A | 6/1994 | Inoue et al. |
| 5,337,283 | A | 8/1994 | Ishikawa |
| 5,528,552 | A | 6/1996 | Kamisaki |
| 5,596,521 | A * | 1/1997 | Tanaka et al. ............ 365/49.12 |
| 5,706,244 | A | 1/1998 | Shimizu |
| 5,774,408 | A | 6/1998 | Shirley |
| 7,193,875 | B2 * | 3/2007 | Kim ........................ 365/49.15 |
| 2004/0184304 | A1 | 9/2004 | Kajigaya et al. |

FOREIGN PATENT DOCUMENTS

| JP | 5-159566 | 6/1993 |
| JP | 5-159567 | 6/1993 |
| JP | 5-182452 | 7/1993 |
| JP | 8-129877 | 5/1996 |
| JP | 2004-103657 | 4/2004 |

OTHER PUBLICATIONS

Japanese Office Action dated Jul. 22, 2008.

* cited by examiner

*Primary Examiner*—Anh Phung
(74) *Attorney, Agent, or Firm*—McGinn IP Law Group, PLC

(57) ABSTRACT

A semiconductor memory device of the invention comprises unit blocks into which the memory cell array is divided, rows of sense amplifiers arranged at one end and the other end of the plurality of bit lines in the unit block, switch means for switching a connection state between the unit block and the row of sense amplifiers attached to the unit block; and control means for controlling the switch means so as to form a transfer path from the row of sense amplifiers attached to a predetermined the unit block leading to the row of sense amplifiers as a saving destination not attached to the predetermined the unit block. This row of sense amplifiers attached to the predetermined the unit block functions as a cache memory.

6 Claims, 36 Drawing Sheets

FIG.3

CONTROL OF TRANSISTOR SWITCHES

| CONTROL STATES | SELECTION CONTROL LINES TO BE SELECTED | STATES OF TRANSISTOR SWITCHES | | | |
|---|---|---|---|---|---|
| | | TSa | TSb | TSc | TSd |
| STATE A | - | OFF | OFF | OFF | OFF |
| STATE B | SLa | ON | OFF | OFF | OFF |
| STATE C | SLb | OFF | ON | OFF | OFF |
| STATE D | SLc | OFF | OFF | ON | OFF |
| STATE E | SLd | OFF | OFF | OFF | ON |
| STATE F | SLa, SLb | ON | ON | OFF | OFF |
| STATE G | SLc, SLd | OFF | OFF | ON | ON |
| STATE H | SLa, SLc | ON | OFF | ON | OFF |
| STATE I | SLb, SLd | OFF | ON | OFF | ON |
| STATE J | SLa, SLb, SLc, SLd | ON | ON | ON | ON |

BOTH CONTROL LINES SLa AND SLb ARE NOT SELECTED

CONTROL LINE SLa IS SELECTED
CONTROL LINE SLb IS NOT SELECTED

CONTROL LINE SLa IS NOT SELECTED
CONTROL LINE SLb IS SELECTED

BOTH CONTROL LINES SLa AND SLb ARE SELECTED

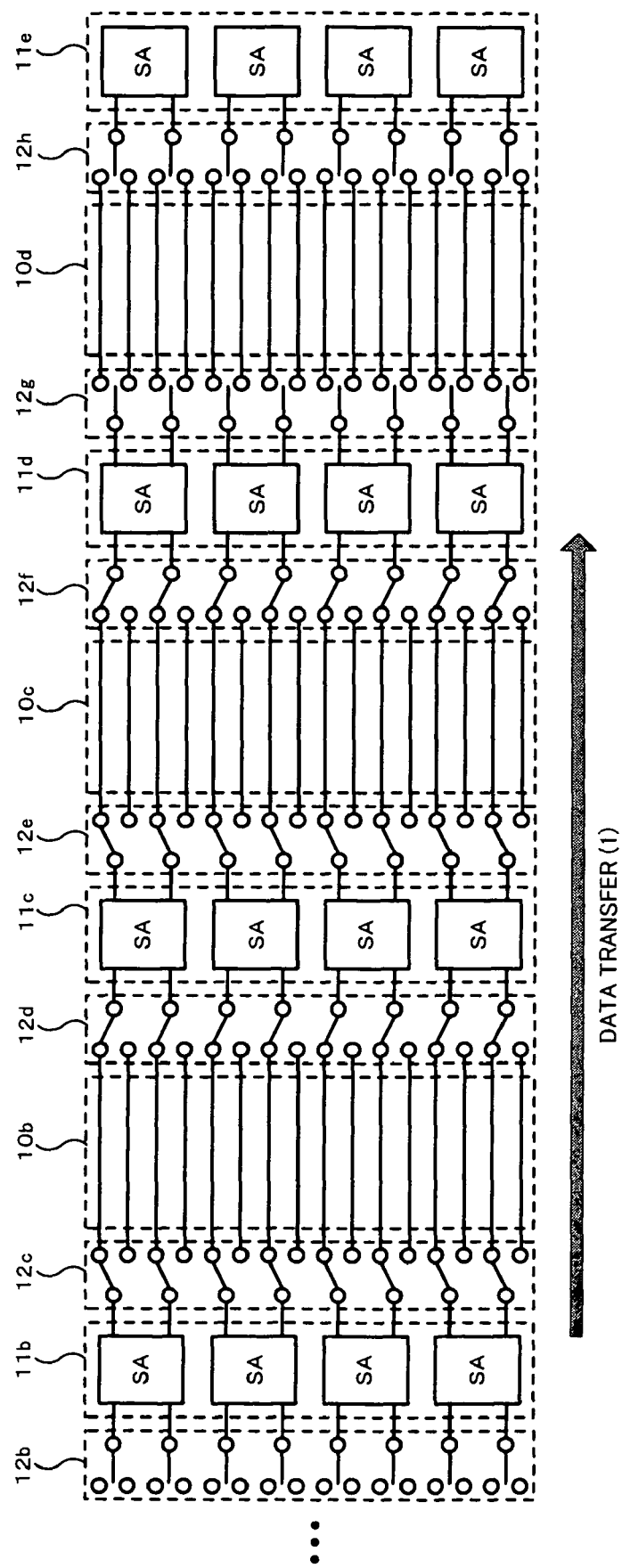

SEMICONDUCTOR MEMORY DEVICE

The present Application is a Divisional Application of U.S. patent application Ser. No. 11/882,827, filed on Aug. 6, 2007 now U.S. Pat. No. 7,573,767, issued on Aug. 11, 2009.

BACKGROUND OF THE INVENTION

1. Field of the Invention

The present invention relates to a semiconductor memory device which rewritably stores data in a memory cell array divided into unit blocks, and particularly relates to a semiconductor memory device having a configuration of storing data of the unit blocks in a cache memory.

2. Description of the Related Art

Generally, a semiconductor memory device such as a DRAM has a configuration in which a memory cell array is divided into a plurality of banks and each bank is further divided into a plurality of unit blocks. Data is stored in a plurality of memory cells formed at intersections between a plurality of word lines and a plurality of bit lines in each unit block. For example, a row of sense amplifiers including a plurality of sense amplifiers is generally arranged on each of both sides of the unit block. Further, a configuration in which switches are provided between each unit block and each row of sense amplifiers has been also proposed (see, for example, Japanese Patent Laid-Open No. 2004-103657). Thus, by configuring the row of sense amplifiers arranged for each unit block, data of the memory cells can be stored in the cache memory every time when an arbitrary word line is selected and activated. That is, the row of sense amplifiers can be used as the cache memory (hereinafter referred to as "sense amplifiers cash").

Generally, refresh operation needs to be performed at a predetermined time interval in order to hold data stored in the DRAM. This refresh operation is controlled so that after bit lines in the unit block to be refreshed are pre-charged, a predetermined word line is selected and activated, and data read from memory cells on the selected word line is amplified by the sense amplifiers and is rewritten into the memory cells. In this case, when the row of sense amplifiers attached to the unit block is being used as a sense amplifiers cache, the stored data in the sense amplifiers cache at that time is destroyed in the refresh operation. Therefore, a time in which data can be held in the sense amplifiers cache is under restriction of a refresh interval. Usually, in the DRAM, data in the sense amplifiers cache needs to be updated each time the refresh operation is performed, and the refresh operation is performed at a short interval of some microseconds. As a consequence, it is a problem that the sense amplifiers cache cannot be used effectively.

Meanwhile, a configuration having a special purpose cache memory provided separately from the memory cell array can be employed. By such a configuration, data in the cache memory is not destroyed, and thus the refresh operation does not have the above mentioned restriction. However, it is improper to provide the special purpose cache memory for each unit block in viewpoints of cost and chip area, and it is not realistic to use a common cache memory for a large number of unit blocks because of complexity in control and configuration for data transfer.

BRIEF SUMMARY OF THE INVENTION

An object of the present invention is to provide a semiconductor memory device which does not have the restriction of the refresh operation and can effectively use the cache memory without complexity in control and configuration, in a case in which the row of sense amplifiers of the semiconductor memory device is used as the cache memory, and also in a case in which the special purpose cache memory is provided for a large number of unit blocks.

An aspect of the present invention is a semiconductor memory device in which a memory cell array including a plurality of memory cells formed at intersections between a plurality of word lines and a plurality of bit lines, comprising: a plurality of unit blocks into which the memory cell array is divided; a plurality of rows of sense amplifiers arranged at one end and the other end of the plurality of bit lines in said unit block and each including a plurality of sense amplifiers for amplifying data of the memory cells for each bit line pair; switch means for switching a connection state between said unit block and said row of sense amplifiers attached to said unit block; and control means for controlling said switch means so as to form a transfer path from said row of sense amplifiers attached to a predetermined said unit block leading to said row of sense amplifiers as a saving destination not attached to the predetermined said unit block, in a state in which said row of sense amplifiers attached to the predetermined said unit block is controlled to be used as a cache memory, for performing a saving operation so that the stored data in the cache memory is saved in said row of sense amplifiers as the saving destination through the transfer path, and for performing a write back operation so that the stored data is written back into the cache memory through the transfer path in reverse direction.

According to the semiconductor memory device of the present invention, the rows of sense amplifiers are provided on both sides of the unit block into which the memory cell array is divided, and when this row is used as a cache memory, control can be performed such that the stored data in the cache memory is not destroyed in operation for the unit block. That is, the store data is saved in the other row of sense amplifiers through a transfer path using bit lines of each unit block by the switching control, and after an intended operation, the data in a saving destination is written back into the cache memory through the transfer path in reverse direction. Thereby, when the sense amplifiers are used in refresh operation or the like, the stored data in the row of sense amplifier as the cache memory can be reliably protected by using the plurality of bit lines as the transfer path without providing a complex configuration.

In the present invention, said control means performs the saving operation in a state in which said row of sense amplifiers attached to said unit block to be refreshed is controlled to be used as the cache memory, thereafter performs a refresh operation for said unit block to be refreshed using said row of sense amplifiers as a saving source, and performs the write back operation after the refresh operation is completed.

In the present invention, each sense amplifier included in said row of sense amplifiers has two input terminals for connecting the bit line pair for said memory mat, and the memory cell is formed at one of two intersections of the bit line pair on an arbitrary word line.

In the present invention, the memory cell array is configured by connecting N (N is an integer larger than or equal to 2) said unit blocks in cascade, and has N−1 said rows of sense amplifiers shared by two adjacent said unit blocks and two unshared said rows of sense amplifiers attached only to said unit blocks located at both ends of the memory cell array.

In the present invention, when the predetermined said unit block is not located at both ends of the memory cell array, said control means controls said switch means so as to form one transfer path from one said row of sense amplifiers attached to the predetermined said unit block leading to said row of sense amplifiers as the saving destination located at the opposite side of adjacent one said unit block, and the other transfer path from the other said row of sense amplifiers attached to the predetermined said unit block leading to said row of sense amplifiers as the saving destination located at the opposite side of adjacent the other said unit block.

In the present invention, when the predetermined said unit block is located at one end or the other end of the memory cell array, said control means controls said switch means so as to form a first transfer path from said row of sense amplifiers shared by two adjacent said unit blocks leading to a first row of sense amplifiers located at the opposite side of the two said unit bocks, and a second transfer path from unshared said row of sense amplifiers leading to a second row of sense amplifiers located at the opposite side of the predetermined said unit block and the adjacent said unit block, performs the saving operation through the first transfer path and thereafter performs the saving operation through the second transfer path, and performs the write back operation through the second transfer path and thereafter performs the write back operation through the first transfer path.

In the present invention, further comprising a wiring pattern including a plurality of wires for connecting said row of sense amplifiers at one end of the memory cell array and said row of sense amplifiers at the other end of the memory cell array for each bit line of corresponding sense amplifier.

In the present invention, the plurality of wires of said wiring pattern is formed on a wiring layer different from a wiring layer on which the plurality of bit lines are formed.

In the present invention, when the predetermined said unit block is located at one end or the other end of the memory cell array, said control means forms a first transfer path from said row of sense amplifiers shared by two adjacent said unit blocks leading to a first row of sense amplifiers located at the opposite side of the two adjacent said unit bocks, and a second transfer path from one unshared said row of sense amplifiers attached to said unit block leading to the other unshared said row of sense amplifiers through the plurality of wires.

The present invention may further comprise a row of sense amplifiers for saving in which data of unshared said row of sense amplifiers attached only to said unit block located at one end of the memory cell array is saved, and switch means for switching a connection state between the unshared said row of sense amplifiers and said row of sense amplifiers for saving, and in the present invention, when the predetermined said unit block is located at one end or the other end of the memory cell array, said control means controls said switch means so as to form a transfer path from the unshared said row of sense amplifiers attached to said unit block leading to said row of sense amplifiers for saving, and performs the saving operation and the write back operation.

Further, an aspect of the present invention is a semiconductor memory device in which a memory cell array including a plurality of memory cells formed at intersections between a plurality of word lines and a plurality of bit lines, comprising: a plurality of unit blocks connected in cascade into which the memory cell array is divided; a plurality of rows of sense amplifiers arranged at one end and the other end of the plurality of bit lines in said unit block and each including a plurality of sense amplifiers for amplifying data of the memory cells for each bit line pair; first switch means for switching a connection state between said unit block and said row of sense amplifiers attached to said unit block; two cache memories for storing two said rows of sense amplifiers attached to one of said unit blocks; second switch means for switching a connection state between unshared rows of sense amplifiers attached only to said unit block located at both ends of the memory cell array and said cache memories; and control means for controlling said first switch means and said second switch means so as to form a transfer path from said row of sense amplifiers attached to a predetermined said unit block leading to said cache memory using the plurality of bit lines, and for performing a transfer operation of data in said row of sense amplifier to said cache memory through the transfer path.

According to the semiconductor memory device of the present invention, in addition to the above-mentioned effect, since a special purpose cache memory is provided, the data in the cache memory can be held regardless of the timing of the refresh operation or the like for the unit block. In this case, since the transfer path from the row of sense amplifiers leading to the cache memory is formed by using the plurality of bit lines of each unit block, a rapid transfer to the cache memory can be achieved without complexity in control and configuration.

In the present invention, said control means transfers data in said row of sense amplifiers attached to said unit block to be refreshed, thereafter performs a refresh operation for said unit block to be refreshed using said row of sense amplifiers as a transfer source.

In the present invention, the memory cell array is configured by connecting N (N is an integer larger than or equal to 2) said unit blocks in cascade, and has N−1 said rows of sense amplifiers shared by two adjacent said unit blocks and two unshared said rows of sense amplifiers attached only to said unit blocks located at both ends of the memory cell array, and one said cache memory is arranged at one end of the memory cell array and the other said cache memory is arranged at the other end of the memory cell array.

In the present invention, an operation circuit for performing an operation using stored data in said cache memory is attached to each of said cache memories.

Furthermore, an aspect of the present invention is a semiconductor memory device in which a memory cell array including a plurality of memory cells formed at intersections between a plurality of word lines and a plurality of bit lines, comprising: a plurality of unit blocks into which the memory cell array is divided; a plurality of rows of sense amplifiers arranged at one end and the other end of the plurality of bit lines in said unit block and each including a plurality of sense amplifiers for amplifying data of the memory cells for each bit line pair; switch means for switching a connection state between said unit block and said row of sense amplifiers attached to said unit block; and control means for controlling said switch means so as to form a transfer path from said row of sense amplifiers as a transfer source attached to a predetermined said unit block leading to said row of sense amplifiers as a transfer destination not attached to the predetermined said unit block using the plurality of bit lines, and controls so that data of the transfer source is transferred to said row of sense amplifiers as the transfer destination.

In the present invention, said memory cell array is configured using a shared sense amplifier scheme in which adjacent said unit blocks share said row of sense amplifiers arranged therebetween.

As described above, according to the present invention, a row of sense amplifiers attached to a unit block can be used as a cache memory in a semiconductor memory device, and saving operation and write back operation are performed by switching control. Therefore, stored data can be prevented from being destroyed even when performing refresh operation. Thus, a large number of rows sense amplifiers can be effectively used as cache memories without being restricted by the refresh operation and the like. Further, according to the present invention, a special purpose cache memory is provided separately from the rows of sense amplifiers in the semiconductor memory device, and a transfer operation is performed using the special purpose cache memory. Therefore, data can be transferred to the cache memory rapidly and reliably by using bit lines of each unit blocks without complexity in control and configuration.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which;

FIG. 3 is a diagram showing ten control states corresponding to on/off control of a switch unit based on selection control lines;

FIG. 36 is a connection state diagram when performing data transfer from the row of sense amplifiers as a copy source to the row of sense amplifiers as a copy destination through a second transfer path in the third embodiment.

DETAILED DESCRIPTION OF THE INVENTION

Preferred embodiments of the present invention will be described with reference to the accompanying drawings. Hereinafter, three embodiments different from one another in which the present invention is applied to a DRAM as a semiconductor memory device will be described respectively.

First Embodiment

Figure 1:
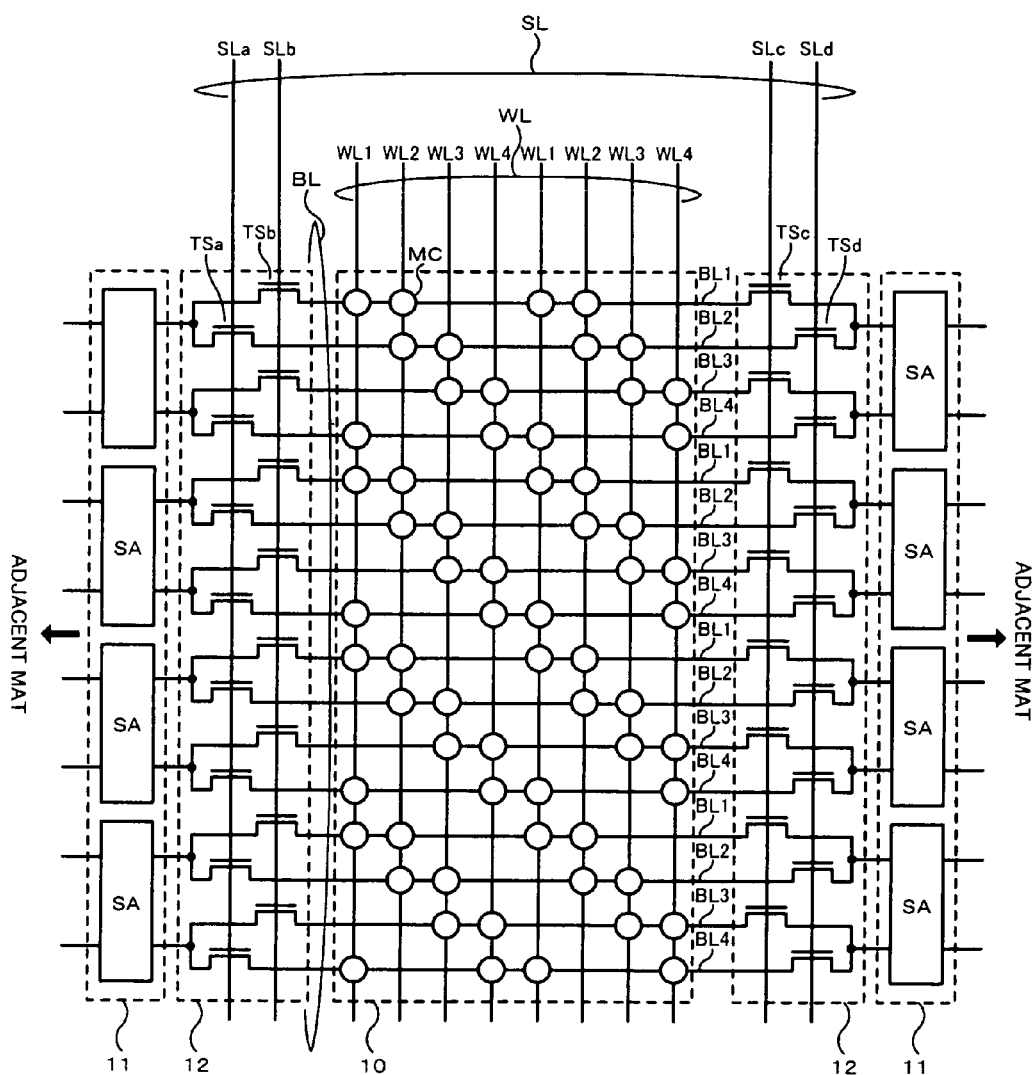
FIG. 1 is a configuration of a DRAM of a first embodiment in which ¼ pitch cell array configuration is employed.
Figure 2:
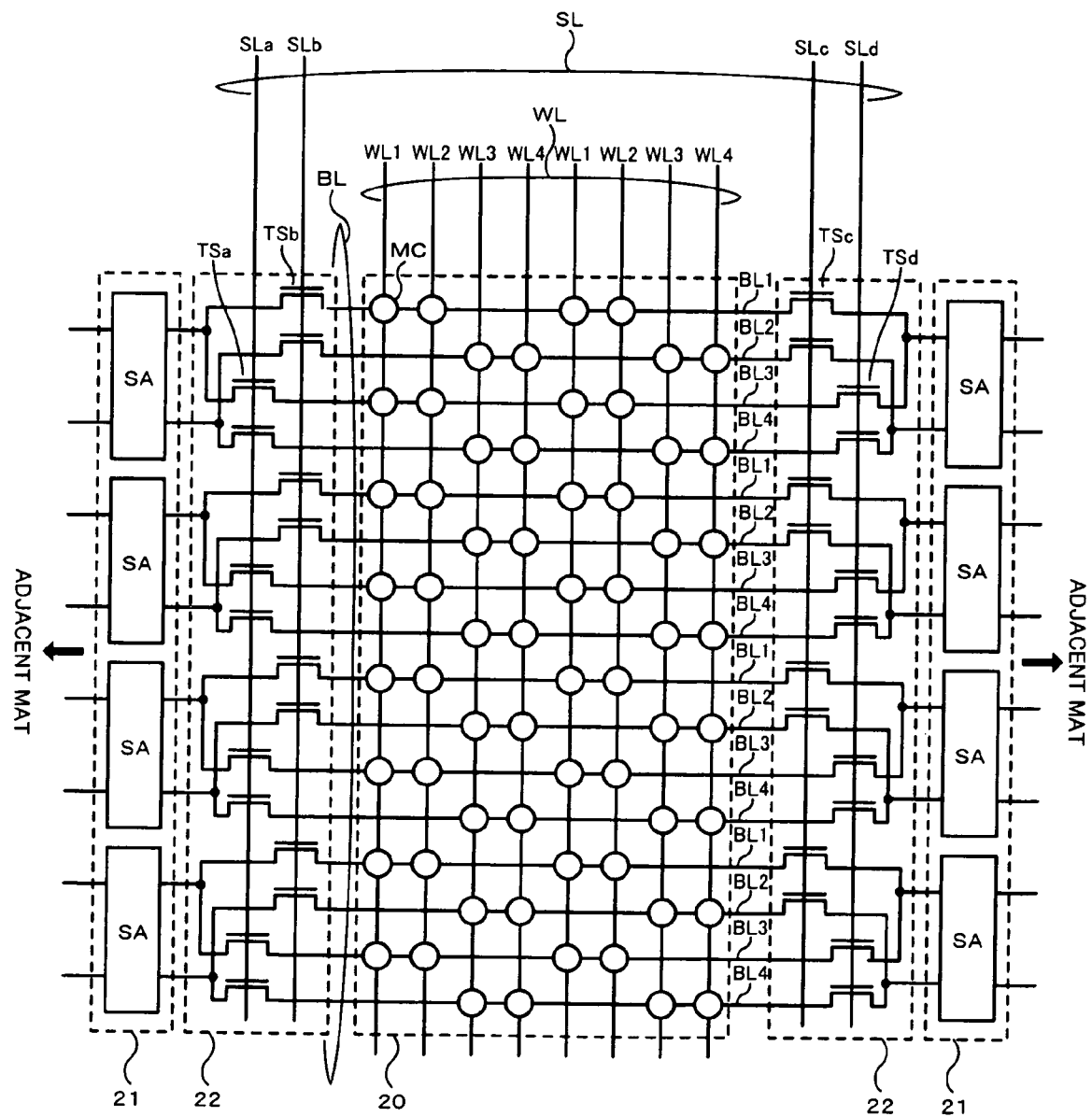
FIG. 2 is a configuration of the DRAM of the first embodiment in which ½ pitch cell array configuration is employed.

A first embodiment of the present invention will be described. FIGS. 1 and 2 show two types of configurations including a memory mat 10 as a unit block which is obtained by dividing a memory cell array of the DRAM of the first embodiment and its peripheral portion. In the first embodiment, a shared sense amplifier scheme is assumed in which adjacent memory mats 10 share sense amplifiers. FIG. 1 shows a configuration called ¼ pitch cell array configuration, and FIG. 2 shows a configuration called ½ pitch cell array configuration, respectively to which the shared sense amplifier scheme is applied.

First, the ¼ pitch cell array configuration will be described. In FIG. 1, a memory mat 10 is formed within a range including a plurality of word lines WL and a plurality of bit lines BL intersecting therewith. Although FIGS. 1 and 2 show an example in which a single memory mat 10 includes eight word lines WL and sixteen bit lines BL, generally a memory mat 10 of a desired size including m word lines WL and n bit lines BL can be formed.

Memory cells MC are formed at intersections corresponding to half of all intersections between the word lines WL and the bit lines BL in the memory mat 10. That is, if m×n intersections exist corresponding to m word lines WL and n bit lines BL, m×n/2 memory cells MC are formed, and the data size of the entire memory mat 10 is m×n/2 bits. Each memory cell MC includes a MOS transistor and a capacitor and stores data of 1 bit corresponding to accumulated charge. An intersection at which a memory cell MC is formed and an intersection at which no memory cell MC is formed are arranged regularly according to a predetermined pattern in the memory mat 10.

The memory cells MC in the memory mat 10 are disposed in the same pattern at every fourth line of both the word lines WL and the bit lines BL. As shown in FIG. 1, word lines WL1, WL2, WL3 and WL4 corresponding to four kinds of the patterns and bit lines BL1, BL2, BL3 and BL4 corresponding to four kinds of the patterns are represented respectively. For example, in the bit line BL1 located at the uppermost of the four bit lines BL in FIG. 1, a pattern in which two intersections with memory cells MC and two intersections without memory cells MC are repeated. In the bit line BL2 located at the second position, the pattern of the bit line BL1 is shifted by one to the right, and in respective bit lines BL3 and BL4 located at the third and fourth positions, the pattern is shifted by one each to the right successively. The word lines WL has the same configuration so that each pattern is shifted by one in the order of the word lines WL1 to WL4.

The configuration of FIG. 1 is called a ¼ pitch cell array configuration because the four word lines WL are arranged in a repetitive unit (1 pitch) while adjacent bit lines BL are shifted by only ¼ of the aforementioned pitch.

On the other hand, two rows of sense amplifiers 11 each including a predetermined number of the sense amplifiers SA are attached to the memory mat 10, and switch units 12 capable of switching the connection state is provided between the memory mat 10 and each of rows of sense amplifiers 11 on the both sides of the memory mat 10. Each switch unit 12 includes four selection control lines SL and a large number of transistor switches controlled to be on/off by the selection control lines SL. In one side of the memory mat 10 (left side in FIG. 1), a row of sense amplifiers 11, selection control lines SLa and SLb and a predetermined number of transistor switches TSa and TSb are included. And in the other side (right side in FIG. 1) of the memory mat 10, a row of sense amplifiers 11, selection control lines SLc and SLd and a predetermined number of transistor switches TSc and TSd are included. In this manner, both sides of the memory mat 10 are configured symmetrically to each other.

The switch unit 12 is connected between the bit lines BL and respective sense amplifiers SA included in the row of sense amplifiers 11. In this case, the transistor switch TSa or TSb is connected to the left side row of sense amplifiers 11, and the transistor switch TSc or TSd is connected to the right side row of sense amplifiers 11. Of the four bit lines as a set, the bit lines BL1 and BL3 of odd numbers from the top of FIG. 1 are connected between the transistor switches TSb and TSc, and the bit lines BL2 and BL4 of even numbers from the top of FIG. 1 are connected between the transistor switches TSa and TSd.

Each sense amplifier SA in the rows of sense amplifiers 11 arranged on both sides of the memory mat 10 has two input terminals. Each input terminal is connected to any of the transistor switches TSa to TSd of the switch unit 12. That is, the two input terminals of each sense amplifiers SA in the left side row of sense amplifiers 11 are connected to both transistor switches TSa and TSb, and the two input terminals of each sense amplifiers SA in the right side row of sense amplifier 11 are connected to both transistor switches TSc and TSd. Thus, all the sense amplifiers SA included in the rows of sense amplifiers 11 on the both sides of the memory mat 10 can be connected to the four bit lines BL as a set selectively through the switch units 12.

The configuration shown in FIG. 1 corresponds to a shared sense amplifier scheme, and each row of sense amplifiers 11 is shared by two adjacent memory mats 10. For example, the left side row of sense amplifiers 11 has two input terminals on the left as well as two input terminals on the right, and the input terminals on the left are connected to other memory mat 10 (not shown) through the switch unit 12. The right side row of sense amplifiers 11 is configured in the same manner. That is, the same connection pattern is repeated on both sides of the configuration shown in FIG. 1. This is the same for FIG. 2. This configuration allows the two adjacent mats 10 to separately use the row of sense amplifiers 11 therebetween by appropriately controlling the switch units 12 on both sides of the row of sense amplifiers 11.

The on/off control of the switch unit 22 based on the selection control lines SL will be described with reference to FIGS. 3 and 4. Since the selection control lines SLa to SLd are connected successively to each gate of the transistor switches TSa to TSd, the transistor switches TSa to TSd can be freely controlled to be on/off by applying desired control signals to the selection control lines SLa to SLd. FIG. 3 shows ten control states (states A to J) corresponding to a combination of selection of the four selection control lines SLa to SLd.

The selection control lines SL to be selected corresponding to the states A to I are controlled to be high and the other selection control lines SL are controlled to be low. The state A is a control state which turns off all the four transistor switches TSa to TSd, the states B to E are control states which turn on only one of the transistor switches TSa to TSd, the states F to I are control states which turn on only two of the transistor switches TSa to TSd, and the state J is a control state which turns on all the four transistor switches TSa to TSd. Changes of connection states corresponding to the above-described control states are shown in FIGS. 4A to 4D by exemplifying one of sense amplifiers SA in the left side row of sense amplifiers 11.

Figure 4A:
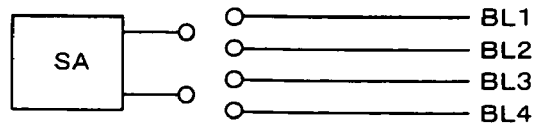
FIGS. 4A to 4D are diagrams showing changes of connection states of a sense amplifier corresponding to on/off control of the switch unit based on the selection control lines.

FIG. 4A shows a connection state of the state A of FIG. 3 in which both selection control lines SLa and SLb are controlled to be not selected (same for the states D, E and G). In this state, both transistor switches TSa and TSb are turned off so that the two input terminals of the sense amplifier SA are disconnected from the four bit lines BL1 to BL4.

Figure 4B:
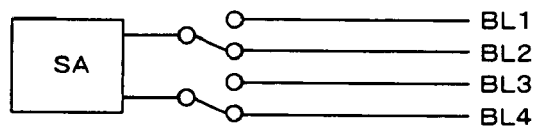
Figure 4C:
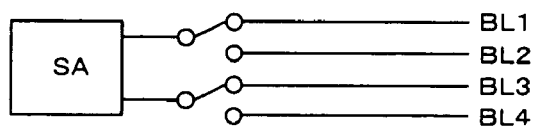

FIGS. 4B and 4C show connection states in which one of the selection control lines SLa and SLb is controlled to be selected while the other is controlled not to be selected. The connection state of FIG. 4B corresponds to the state B (state H also) of FIG. 3, in which only the transistor switch TSa is turned on by the selection control line SLa so that the even number bit lines BL2 and BL4 are connected to two input terminals of the sense amplifier SA. Further, the connection state of FIG. 4C corresponds to the state C (state I also) of FIG. 3, in which only the transistor switch TSb is turned on by the selection control line SLb so that the odd number bit lines BL1 and BL3 are connected to two input terminals of the sense amplifier SA.

In other words, either of a bit line pair composed of the odd number bit lines BL1 and BL3 or a bit line pair composed of the even number bit lines BL2 and BL4 is connected to the two input terminals of the sense amplifier SA. In this case, two bit lines BL arranged on every other line constitute the bit line pair, while an odd number bit line and an even number bit line BL do not constitute the bit line pair. As understood from FIG. 1, if the bit line pair is constituted in this combination, memory cells MC are connected to only one input terminal of each sense amplifier SA when an arbitrary word line WL is selected.

Figure 4D:
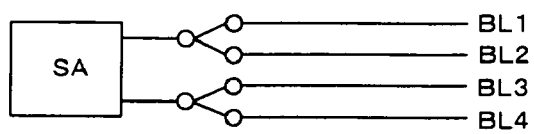

FIG. 4D shows a connection state of the state F (state J also) of FIG. 3 in which both selection control lines SLa and SLb are controlled to be selected. This state allows both transistor switches TSa and TSb to turn on so that both bit lines BL1 and BL2 are connected to one input terminal of the sense amplifier SA while both bit lines BL3 and BL4 are connected to the other input terminal. As described later, the connection state of FIG. 4D is set when the four bit lines BL1 to BL4 are pre-charged at the same time in a given control operation.

Although FIGS. 4A to 4D show the connection states of the sense amplifier SA in the left side row of sense amplifiers 11 of FIG. 1, the same configuration is basically applied to the sense amplifier SA in the right side row of sense amplifiers 11 of FIG. 1 and thus, connection states symmetrical to FIG. 4D may be assumed.

Next, the configuration of FIG. 2 will be described. FIG. 2 shows a memory mat 20 formed within a range including a plurality of the word lines WL and a plurality of the bit lines BL like FIG. 1. Although this configuration is the same as FIG. 1 in that the memory cells MC are formed at intersections corresponding to half of all intersections between the word lines WL and the bit lines BL, the arrangement of the memory cells MC is different. That is, the configuration of FIG. 2 is called a ½ pitch cell array configuration because the four word lines WL are arranged in a repetitive unit (1 pitch) while adjacent bit lines BL are shifted by only half of the aforementioned pitch (corresponding to two memory cells MC).

Two rows of sense amplifiers 21 each including a predetermined number of the sense amplifiers SA, four selection control lines SL and switch units 22 each including a plurality of transistor switches controlled to be on/off by the selection control lines SL are provided around the memory mat 20. Although respective components of FIG. 2 are common to FIG. 1 in this case, its connection form is different from FIG. 1, reflecting a difference in the arrangement of the memory cells MC of the memory mat 20.

More specifically, of four bit lines BL as a set, adjacent bit lines BL1 and BL2 are connected between the transistor switches TSb and TSc, while adjacent bit lines BL3 and BL4 are connected between the transistor switches TSa and TSd. Two input terminals of each sense amplifier SA in the left side row of sense amplifiers 21 are connected to both transistor switches TSa and TSb, and two input terminals of each sense amplifier SA in the right side row of sense amplifiers 21 are connected to both transistor switches TSc and TSd.

Comparing the configuration of FIG. 2 with the configuration of FIG. 1, combinations of the bit lines BL connected to the two input terminals of the sense amplifier SA through the switch unit 22 are different. On the other hand, the on/off control of the switch unit 12 based on the selection control lines SL has ten control states like FIG. 3, and a connection state in which the positions of the bit lines BL (two bit lines BL2 and BL3) are exchanged in FIG. 4 should be assumed. In this case, either of a bit line pair composed of adjacent bit lines BL1 and BL2 or a bit line pair composed of adjacent bit lines BL3 and BL4 is connected to the two input terminals of the sense amplifier SA. As understood from FIG. 2, if the bit line pairs are constituted in such a combination, the memory cells MC are connected to only one input terminal of each sense amplifier SA when an arbitrary word line WL is selected, like in FIG. 1.

Figure 5:
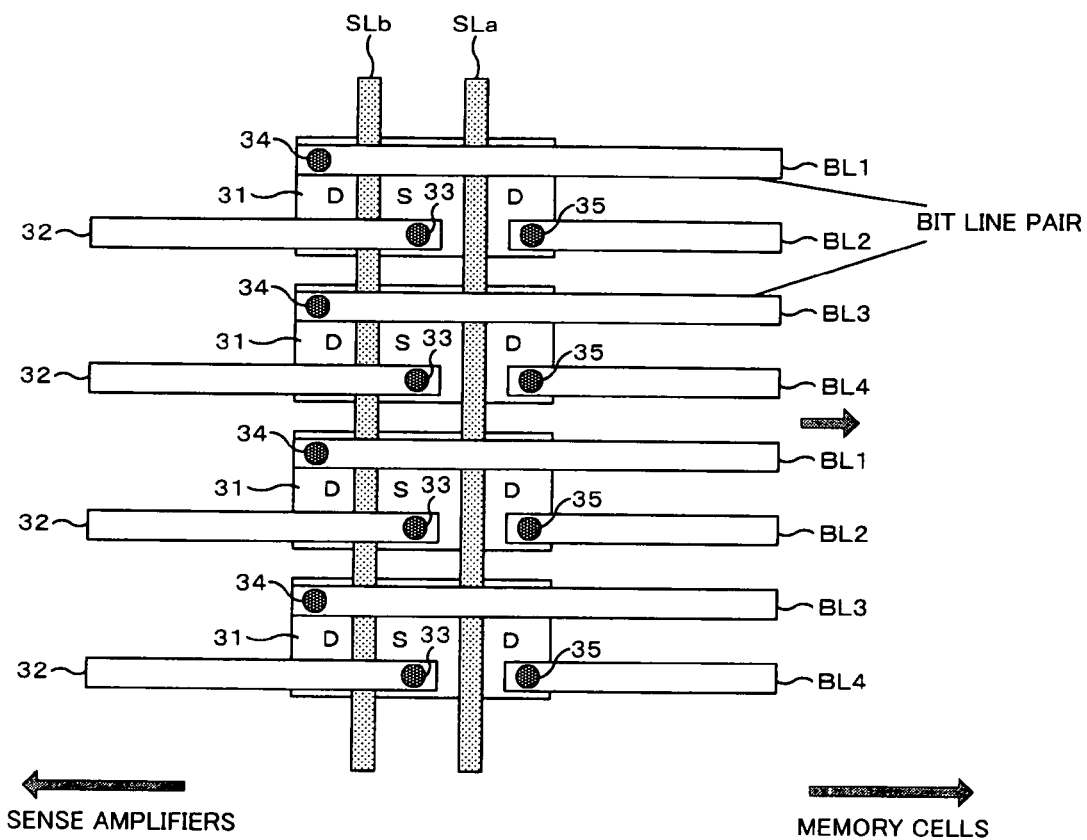
FIG. 5 is a diagram showing an example of a first layout of the switch unit corresponding to the ¼ pitch cell array configuration of FIG. 1.

Next, examples of a layout of the switch unit 12 in a case where the first embodiment is constructed on a semiconductor chip will be described. FIG. 5 shows an example of a first layout of the switch unit 12 corresponding to the ¼ pitch cell array configuration of FIG. 1. The layout of FIG. 5 includes transistor switches TSa and TSb connected to the two sense amplifiers SA in the left side row of sense amplifiers 11 of FIG. 1, in the switch unit 12 and its peripheral portion. A pair of the transistor switches TSa and TSb is composed of combined MOS transistors. Four rectangular diffusion layers 31 formed corresponding to the MOS transistors are arranged in a line in a range shown in FIG. 5, and four pairs of the transistor switches TSa and TSb can be formed thereon.

Two selection control lines SLa and SLb arranged in parallel to each other serve as gate electrodes in each diffusion layer 31, and a source S between the selection control lines SLa and SLb and two drains D on both sides thereof are formed. A wire 32 connected to one input terminal of each sense amplifier SA is connected to the source S of the diffusion layer 31 through a contact 33. Each of the odd number bit lines BL1 and BL3 is connected to one drain D of the diffusion layer 31 through a contact 34. Further, each of the even number bit lines BL2 and BL4 are connected to the other drain D of the diffusion layer 31 through a contact 35. As described above, the two bit lines BL arranged on every other line form a bit line pair connected to one sense amplifier SA.

When employing the layout of FIG. 5, each diffusion layer 31 needs to have a size which allows an arrangement with a gap corresponding to two bit lines BL. Thus, the entire layout area can be reduced, but the width of a channel of each MOS transistor which depends upon the size of the diffusion layer 31 is limited.

Figure 6:
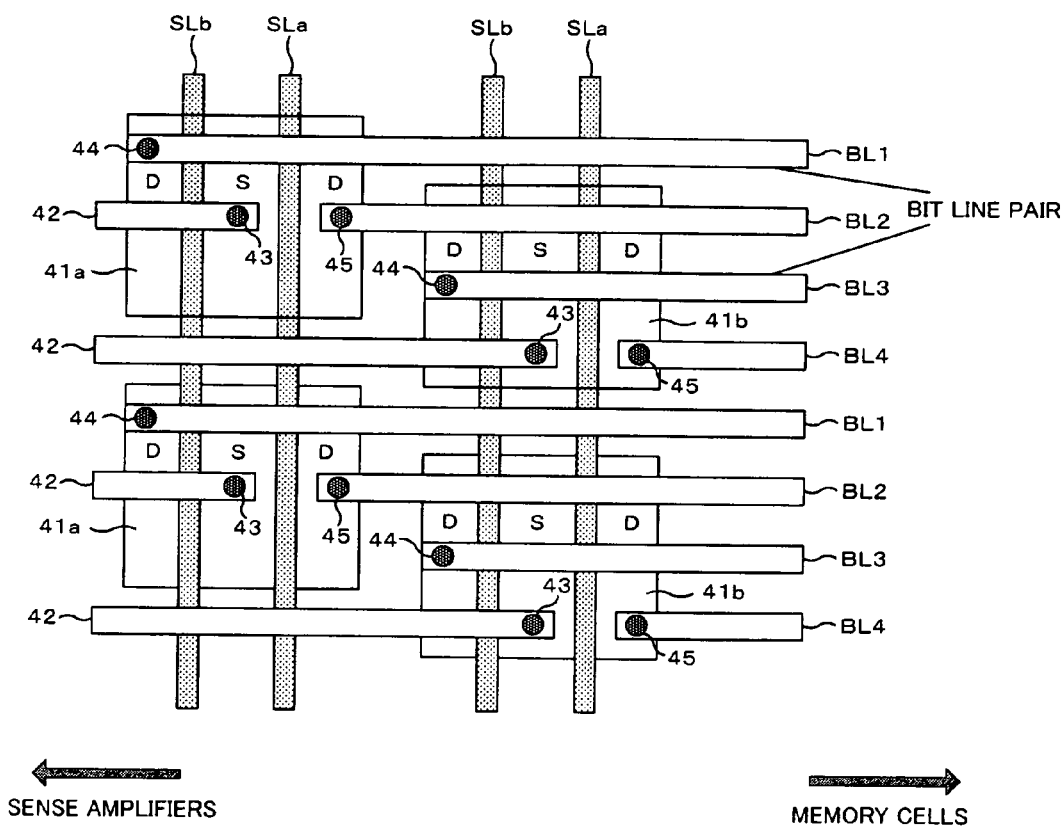
FIG. 6 is a diagram showing an example of a second layout of the switch unit corresponding to the ¼ pitch cell array configuration of FIG. 1.

FIG. 6 shows an example of a second layout of the switch unit 12 corresponding to the ¼ pitch cell array configuration of FIG. 1. The layout of FIG. 6 includes four diffusion layers 41 (41a and 41b) and the MOS transistors forming four pairs of transistor switches TSa and TSb in the switch unit 12, as similar components to FIG. 5. However a difference exists in the shape and arrangement of the diffusion layer 41 as compared with FIG. 5. That is, the respective diffusion layers 41 are not arranged in a line but two diffusion layers 41a and two diffusion layers 41b are formed at each shifted position, so that they are arranged in two lines.

Since the selection control lines SLa and SLb are used as gate electrodes of the diffusion layers 41a and 41b, every two selection control lines, totaling four lines, are arranged in parallel. A source S between the selection control lines SLa and SLb and two drains D on both sides thereof are formed in each of the diffusion layers 41a and 41b. A wire 42 connected to one input terminal of each sense amplifier SA is connected to the source S of the diffusion layer 41a or 41b through a contact 43. Each of the odd number bit lines BL1 and BL3 is connected to one drain D of each of the diffusion layers 41a and 41b through a contact 44. Further, each of the even number bit lines BL2 and BL4 is connected to the other drain D of each of the diffusion layers 41a and 41b through a contact 45. The bit line pairs shown in FIG. 6 are formed in the same combination as in FIG. 5.

However, when employing the layout of FIG. 6, the respective diffusion layers 41a and 41b can have a size which allows an arrangement with a gap corresponding to four bit lines BL, different from the layout of FIG. 5. The size necessary in the extending direction of the bit line BL is increased because of the diffusion layers 41a and 41b arranged in two lines. Thus, although the entire layout area is increased, the channel width of the MOS transistors can be increased sufficiently. Accordingly, sufficient current can be supplied to the MOS transistors of the switch unit 12, whereby providing an advantageous configuration from viewpoints of operating speed.

Figure 7:
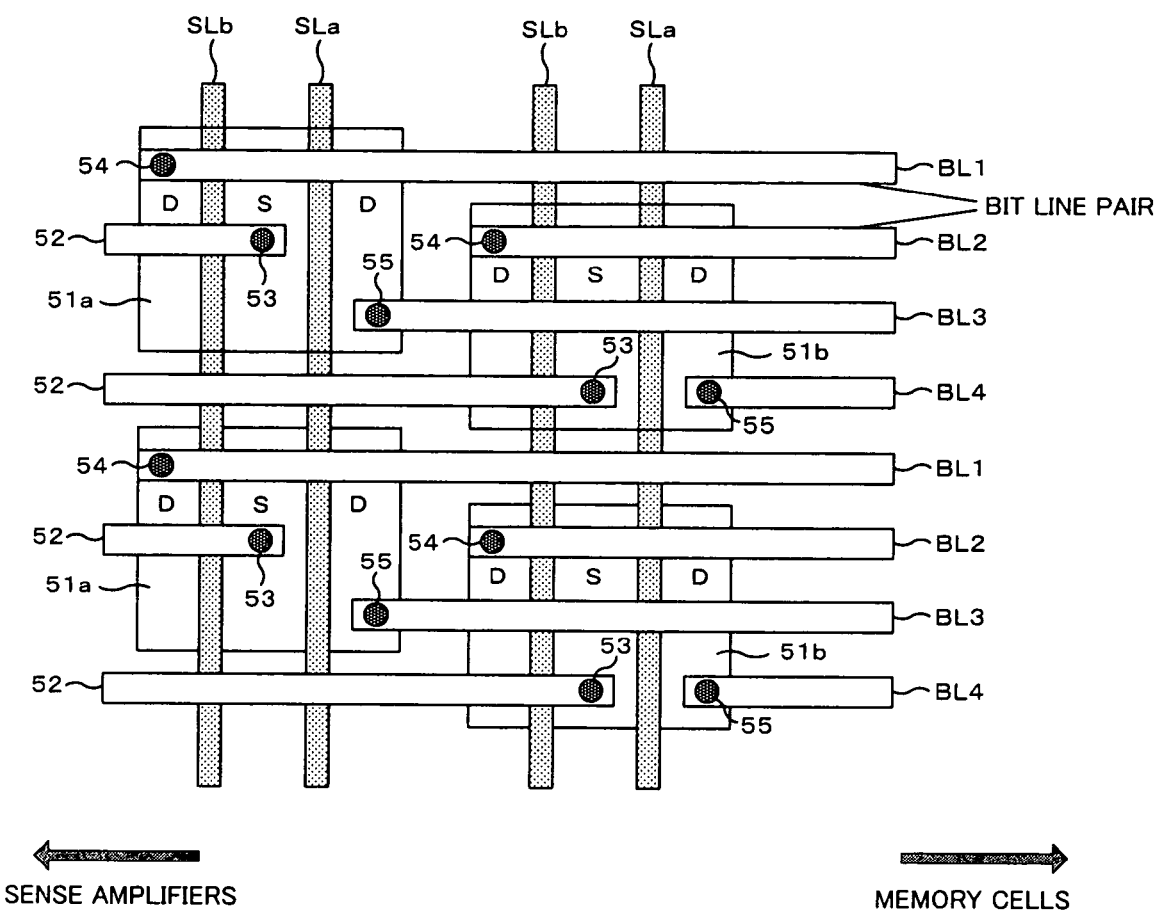
FIG. 7 is a diagram showing an example of a layout of the switch unit corresponding to the ½ pitch cell array configuration of FIG. 2.

Next, FIG. 7 shows an example of a layout of the switch unit 22 corresponding to the ½ pitch cell array configuration of FIG. 2. The layout of FIG. 7 includes transistor switches TSa and TSb connected to two sense amplifiers SA in the left side row of sense amplifiers 21 of FIG. 2, in the switch unit 22 and its peripheral portion. In this case, the shape and arrangement of the diffusion layers 51a and 51b corresponding to the MOS transistors and the configuration of the selection control lines SLa and SLb are common to the layout of FIG. 6.

In each of the diffusion layers 51a and 51b, the selection control lines SLa and SLb are used as gate electrodes, and a source S between the selection control lines SLa and SLb and two drains D on both sides thereof are formed. A wire 52 connected to one input terminal of each sense amplifier SA is connected to the source S of the diffusion layer 51a or 51b through a contact 53. The bit lines BL are connected to the two drains D on both sides of the diffusion layers 51a and 51b through contacts 54 and 55, and the two bit lines BL are arranged on every other line. The layout of FIG. 6 reflects the configuration of FIG. 2, thereby achieving a layout for forming a bit line pair including adjacent two bit lines BL.

In addition, the entire layout area is increased when employing the layout of FIG. 7, but it is the same as the layout of FIG. 6 in that the channel width of the MOS transistors can be increased.

Next, operation and control method of the DRAM of the first embodiment will be described. Hereinafter, the operation in which refresh is performed at a predetermined interval while using the row of sense amplifiers 11 as a sense amplifier cache is assumed. Further, following description is made for a case of employing the ¼ pitch cell array configuration shown in FIG. 1.

Figure 8:
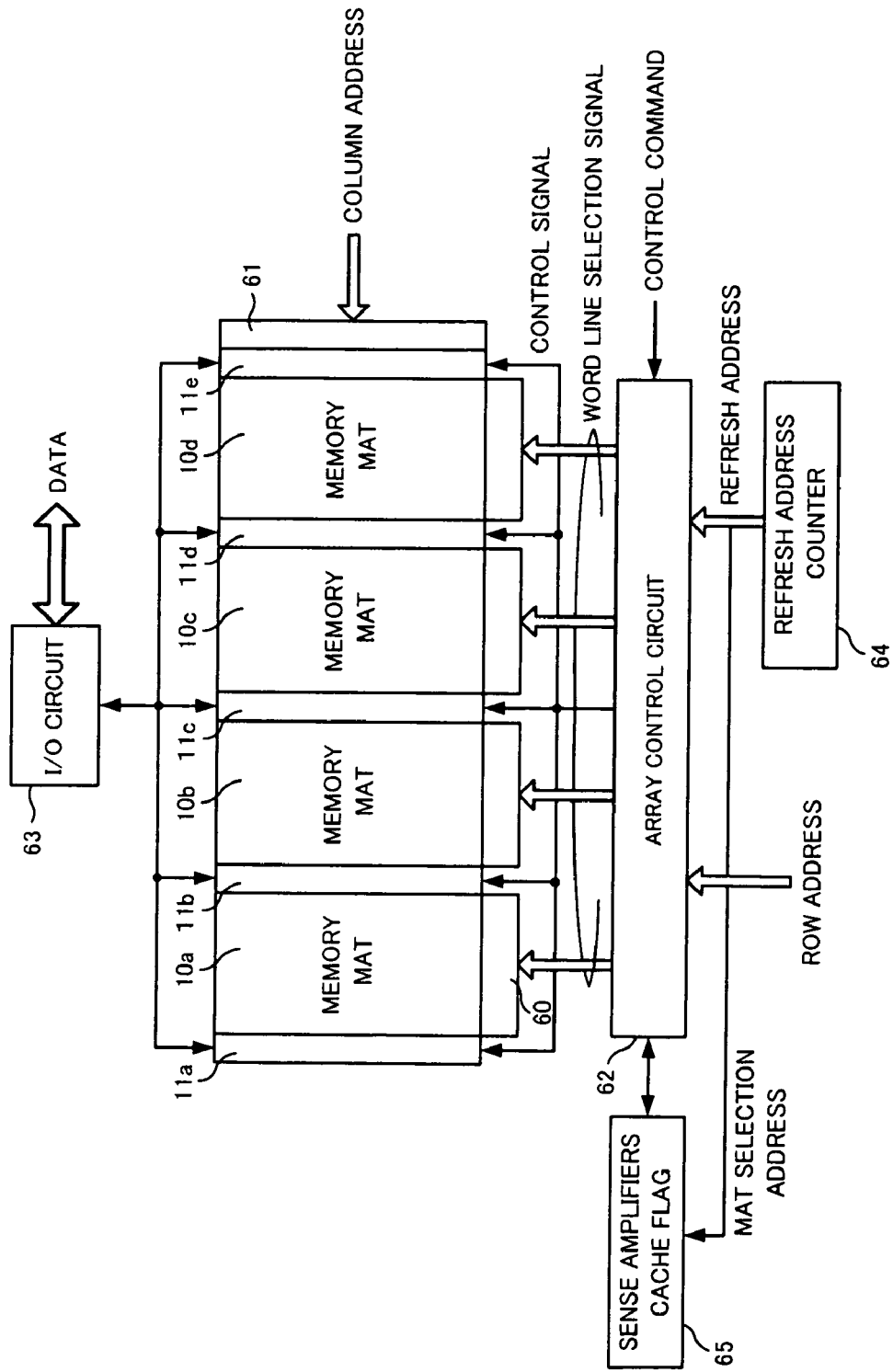
FIG. 8 is a block diagram showing a schematic configuration of the DRAM of the first embodiment.

FIG. 8 is a block diagram showing a schematic configuration of the DRAM of the first embodiment. In the configuration of FIG. 8, regarding an arbitrary bank of the memory cell array, four memory mats 10 are included in one bank. The actual memory cell array is divided into a predetermined number of banks (not shown), and the operation is controlled for each bank individually.

The memory mats 10 in the configuration of FIG. 8 are four memory mats 10a, 10b, 10c and 10d connected in cascade, in the order from the left. Further, five rows of sense amplifiers 11a, 11b, 11c, 11d and 11e are arranged, in the order from the left, corresponding to the shared sense amplifier scheme. The row of sense amplifiers 11a at the left end and the row of sense amplifiers 11e at the right end are unshared rows of sense amplifiers 11. A plurality of the switch units 12 (not shown) are arranged between the memory mats 10a to 10d and the rows of sense amplifiers 11a to 11e. Further, there are provided four row decoders 60 each for selecting a word line WL corresponding to a designated row address for each memory mat 10, and a column decoder 61 for selecting a bit line BL corresponding to a designated column address.

An array control circuit 62, an I/O circuit 63, a refresh address counter 64 and a sense amplifiers cache flag 65 are provided in the peripheral portion of the memory cell array of FIG. 8. The array control circuit 62 controls the operation of the entire memory cell array, controls read operation, write operation and refresh operation, and controls operation for using the row of sense amplifiers 11 as the sense amplifiers cache. The array control circuit 62 supplies word line selection signals based on the row address to the row decoders 60 and supplies control signals to the rows of sense amplifiers 11 and the switch units 12.

Control commands for controlling the operation are input to the array control circuit 62 from outside. When a read or write command is input, read or write data of the memory mat 10 is input or output between the I/O circuit 63 and the outside through the row of sense amplifiers 11 under the control of the array control circuit 62. Meanwhile, when a refresh command for holding data in the memory cell array is input, the array control circuit 62 controls the refresh operation for a selected word line WL of a corresponding memory mat 10 based on a refresh address generated by the refresh address counter 64.

The array control circuit 62 controls the operation of a plurality of rows of sense amplifiers 11 as the sense amplifiers caches at the time of normal operation or refresh operation. In the sense amplifiers cache flag 65, a mat selection address for determining the row of sense amplifiers 11 to be accessed and state information for determining whether or not each row of sense amplifiers 11 is used as the sense amplifiers cache, are stored. The array control circuit 62 can appropriately control the plurality of rows of sense amplifiers 11 in accordance with the use of the sense amplifiers cache by referring to the sense amplifiers cache flag 65 at the time of the refresh operation.

Although a configuration in which four memory mats 10 are connected in cascade is shown in the example of FIG. 8, the present invention is not limited to such a configuration, and can be applied to a configuration including N (N is an integer larger than or equal to 2) memory mats 10 connected in cascade, N−1 rows of sense amplifiers 11 shared by two adjacent memory mats 10, and two unshared rows of sense amplifiers 11.

Figure 9:
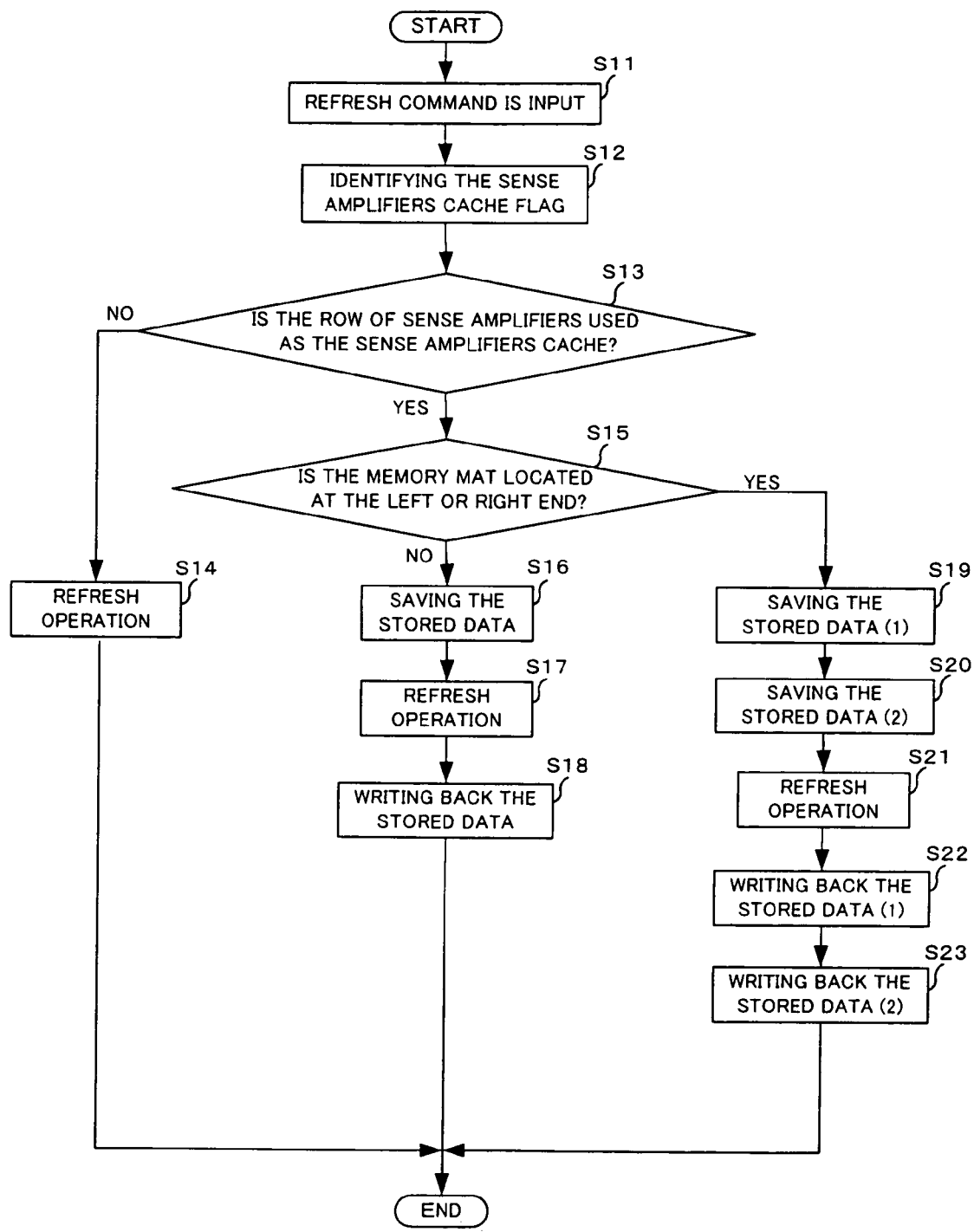
FIG. 9 is a flow chart schematically showing refresh control of the first embodiment.

FIG. 9 is a flow chart schematically showing the refresh control of the first embodiment. As shown in FIG. 9, when the refresh command is input (step S11), the array control circuit 62 identifies the sense amplifiers cache flag 65 (step S12). Thereby, the mat selection address and the state information of the sense amplifiers cache are extracted, and a position of the memory mat 10 to be refreshed and a state of the use of the sense amplifiers cache can be determined.

Then, if the row of sense amplifiers 11 attached to the memory mat 10 to be refreshed is not used as the sense amplifiers cache (step S13:NO), subsequently the normal refresh operation is performed (step S14). On the other hand, if the row of sense amplifiers 11 attached to the memory mat 10 to be refreshed is used as the sense amplifiers cache (step S13:YES), the position of the memory mat 10 is determined and a later described process in accordance with the determination result is performed (step S15).

Figure 10:
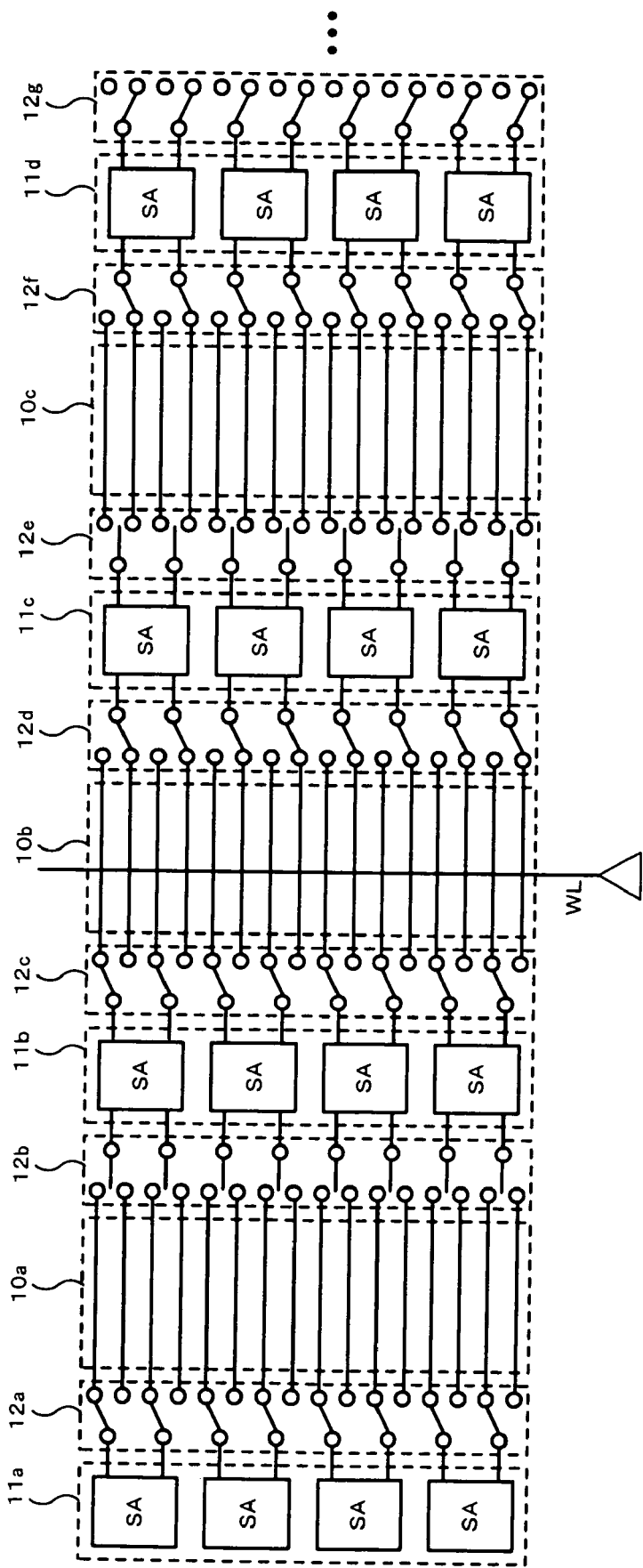
FIG. 10 is a connection state diagram when performing the refresh operation for a memory mat in the first embodiment.

Herein, the refresh operation of step S14 will be described in which the memory mat 10b located at the second position from the left in FIG. 8 is selected. FIG. 10 is a connection state diagram when performing the refresh operation for a predetermined word line WL after the memory mat 10b is precharged. As shown in FIG. 10, two switch units 12c and 12d are controlled so that the odd number bit lines BL1 and BL3 are connected to the left side row of sense amplifiers 11b and the even number bit lines BL2 and BL4 are connected to the right side row of sense amplifiers 11c. Thus, each of all the bit lines BL of the memory mat 10b are connected to one of the sense amplifiers SA. On the contrary, the switch units 12b and 12e located at the opposite sides of the rows of sense amplifiers 11b and 11c are controlled so as to be disconnected from the bit lines BL.

When a row address to be refreshed is designated, the predetermined word line WL of the memory mat 10b is selected correspondingly. The memory cells MC are arranged at intersections corresponding to half of intersections between the selected word line WL and the bit lines BL. When the selected word line WL is activated, half of the data of the memory cells MC is amplified by sense amplifiers SA of one row of sense amplifiers 11b, remaining half of the data of the memory cells MC is amplified by sense amplifiers SA of the other row of sense amplifiers 11c, and the data is rewritten to the original memory cells MC.

Next, processes when shifting from step S13 to step S15 will be describe. In step S15, if it is determined that the memory mat 10 to be refreshed is not located at the left end or the right end of the memory cell array (step S15:NO), a process of steps S16 to S18 is performed, while if it is determined that the memory mat 10 to be refreshed is located at the left end or right end of the memory cell array (step S15:YES), a process of steps S19 to S23 is performed.

Figure 11:
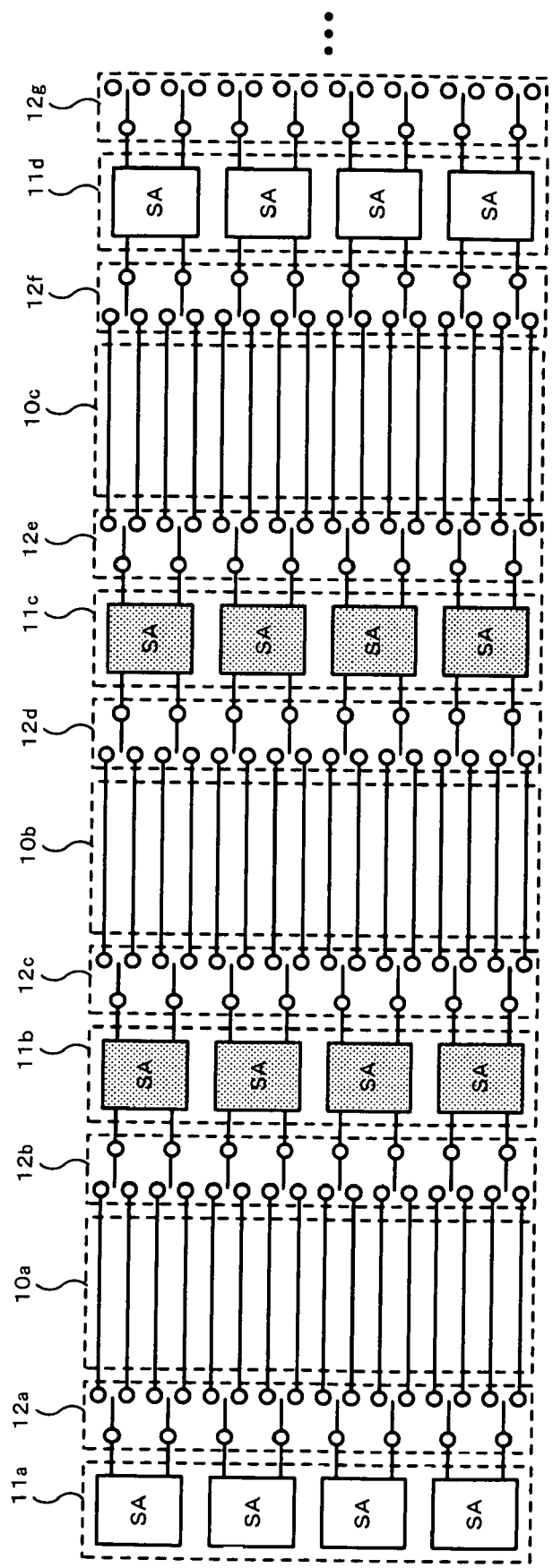
FIG. 11 is a connection state diagram when both rows of sense amplifiers attached to the memory mat are used as sense amplifier caches.

First, the process of steps S16 to S18 will be described by exemplifying a case in which the memory mat 10b is selected to be refreshed. FIG. 11 is a connection state diagram when both rows of sense amplifiers 11b and 11c attached to the memory mat 10b are used as the sense amplifier caches. In FIG. 11, the rows of sense amplifiers 11b and 11c on the both sides of the memory mat 10b are used as the sense amplifier caches, which are in a data holding state. The switch unit 12c connected to the row of sense amplifiers 11b and the switch unit 12d connected to the row of sense amplifiers 11c are both disconnected. In this case, regarding data on the predetermined word line WL, data of half of the memory cells MC are stored in one row of sense amplifiers 11b, while data of remaining half of the memory cells MC are stored in the other row of sense amplifiers 11c. In the example of FIG. 11, switching of the memory mats 10a and 10c on the left and right sides of the memory mats 10b is controlled in the same manner.

Figure 12:
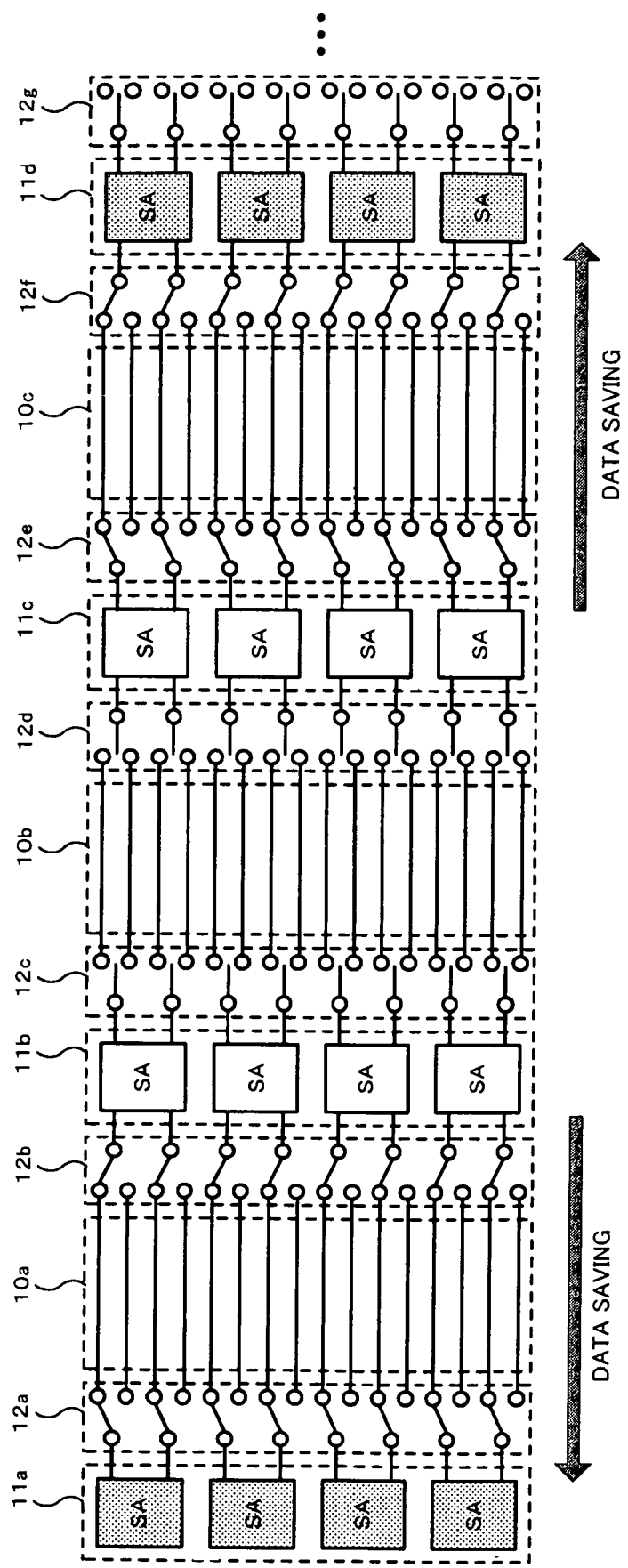
FIG. 12 is a connection state diagram subsequent to FIG. 11 when forming a transfer path for stored date in the sense amplifier cache regarding two rows of sense amplifiers attached to the memory mat.

Then, regarding the two rows of sense amplifiers 11b and 11c of FIG. 11, the stored data in the sense amplifier cache is saved (step S16). FIG. 12 shows a connection state diagram corresponding to step S16. In the example of FIG. 12, data in the row of sense amplifiers 11b on the left side of the memory mat 10b is saved in the further left side row of sense amplifier 11a, while data in the row of sense amplifiers 11c on the right side of the memory mat 10b is saved in the further right side row of sense amplifier 11d.

Switching control to save data in the above described manner is such that the odd number bit lines BL1 and BL3 of the left side memory mat 10a are connected to sense amplifiers SA of the rows of sense amplifiers 11a and 11b through the switch units 12a and 12b on the both sides, and the odd number bit lines BL1 and BL3 of the right side memory mat 10c are connected to sense amplifiers SA of the rows of sense amplifiers 11c and 11d through the switch units 12e and 12f on the both sides. Meanwhile, the switch units 12c and 12d on the both sides of the memory mat 10b are disconnected.

By such switching control, a transfer path from the row of sense amplifiers 11b leading to the row of sense amplifier 11a through the switch unit 12b, the memory mat 10a and the switch unit 12a is formed on the left side of the memory mat 10b, and a transfer path from the row of sense amplifiers 11c leading to the row of sense amplifiers 11d through the switch unit 12e, the memory mat 10c and the switch unit 12f is formed on the right side of the memory mat 10b. By transferring data through the two transfer paths at the same time, saving operation of the stored data in the rows of sense amplifier 11a and 11d is completed.

Figure 13:
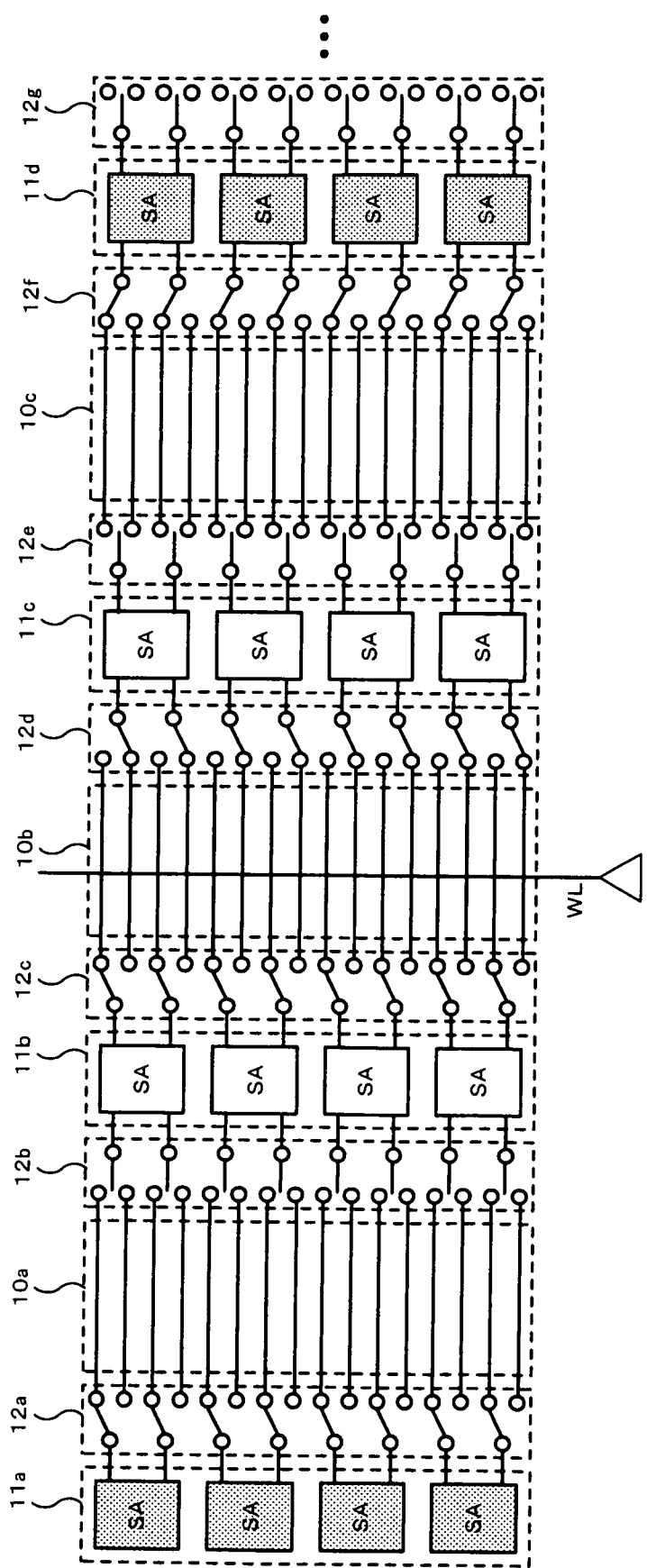
FIG. 13 is a connection state diagram subsequent to FIG. 12 when performing the refresh operation for the memory mat to be refreshed.

Subsequently, the refresh operation for the memory mat 10 to be refreshed is performed (step S17). FIG. 13 shows a connection state corresponding to step S17. In FIG. 13, sates of the memory mat 10b to be refreshed and the switch units 12c and 12d on the both sides thereof are the same as in FIG. 10. Meanwhile, the switch units 12b and 12e on the opposite sides of the rows of sense amplifiers 11b and 11c are disconnected. Refresh for the selected word line WL is performed in the same manner as in FIG. 10.

Figure 14:
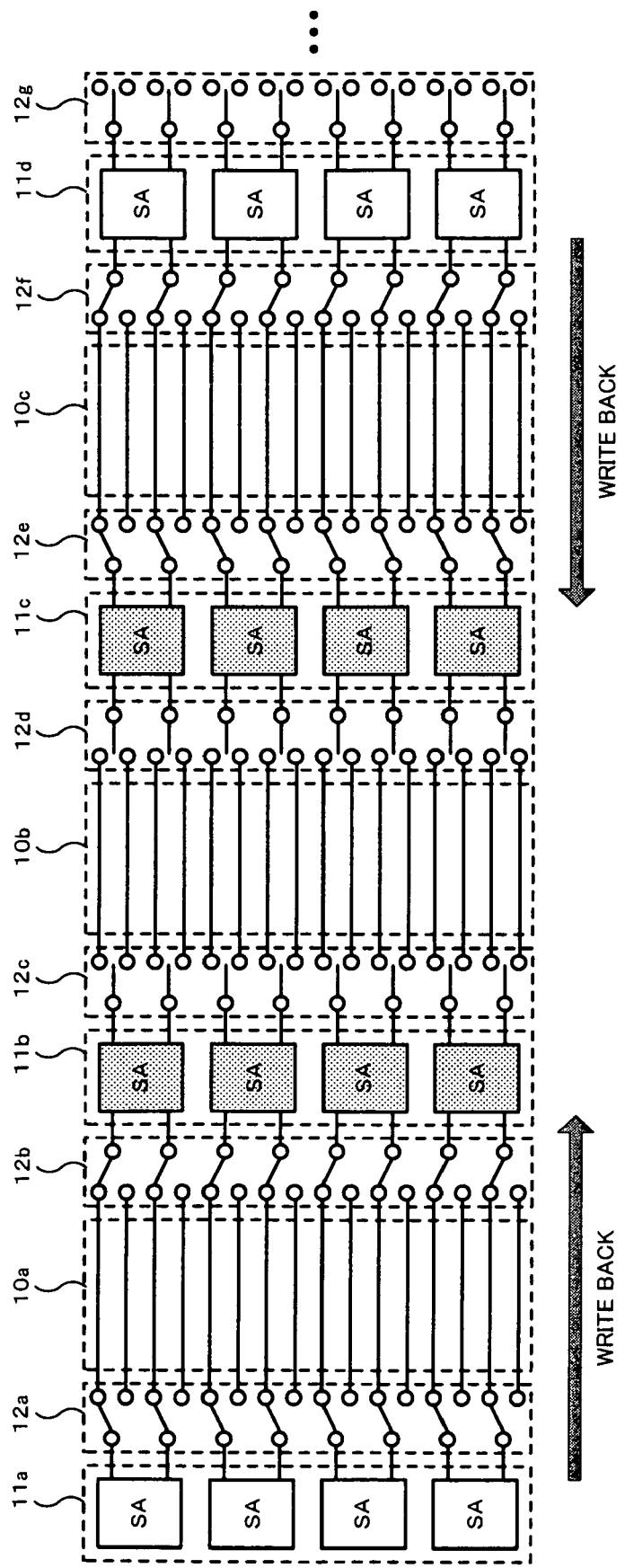
FIG. 14 is a connection state diagram subsequent to FIG. 13 when writing back the stored data from the row of sense amplifiers as a saving destination to the row of sense amplifiers as a saving source.

Subsequently, after the refresh operation is completed, the stored data is written back from the rows of sense amplifier 11a and 11d as saving destinations into the rows of sense amplifiers 11b and 11c as saving sources (step S18). FIG. 14 shows a connection state diagram corresponding to step S18. Switching operation for the switch units 12a to 12h in this case is the same as in FIG. 12. By this, the above-mentioned transfer path and the reverse path are formed by the odd number bit lines BL1 and BL3, the stored data in the left side row of sense amplifiers 11a is written back into the row of sense amplifiers 11b, and the stored data in the right side row of sense amplifiers 11d is written back into the row of sense amplifiers 11c.

Next, a process of steps S19 to S23 will be described by exemplifying a case in which the memory mat 10a located at the left end is selected to be refreshed. In the first embodiment, if the memory mat 10 is located at each of both ends of the memory cell array, a process different from those of other memory mats 10 are applied. For example, in the case of the memory mat 10a at the left end, since a transfer path leading to the left cannot be formed, two transfer paths need to be formed to perform the saving in two steps.

Figure 15:
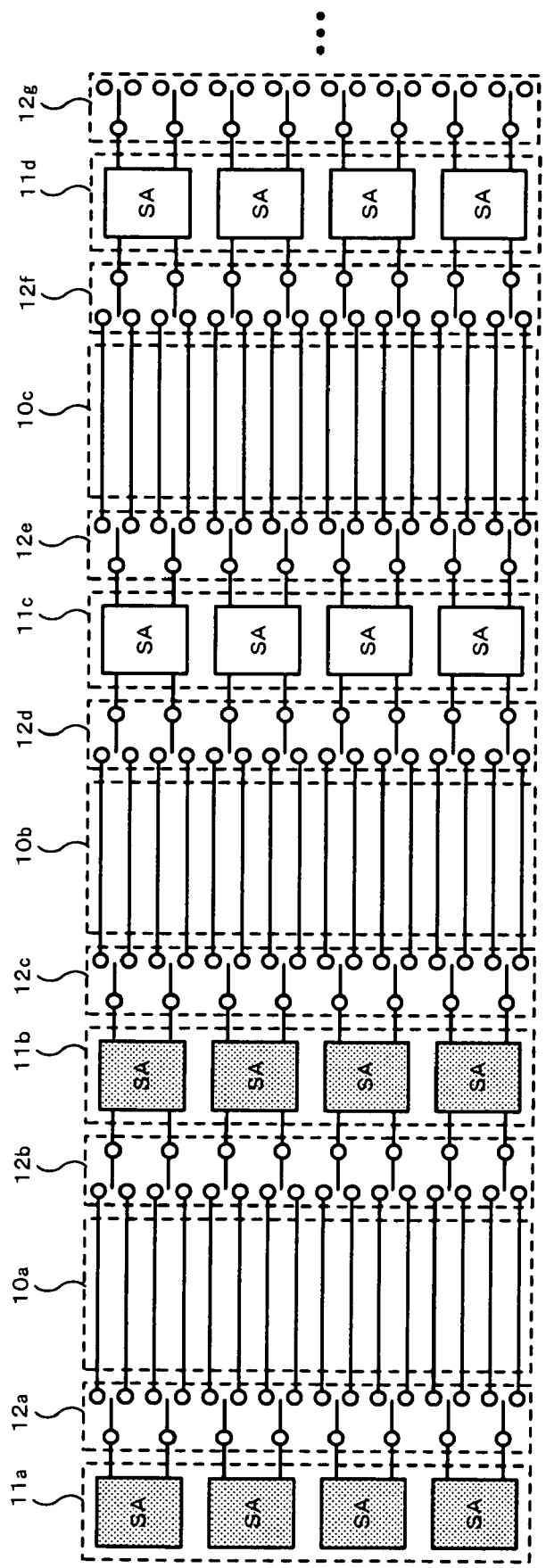
FIG. 15 is a connection state diagram when both rows of sense amplifiers attached to the memory mat 10b at the left end are used as the sense amplifier caches in the first embodiment.

FIG. 15 is a connection state diagram when both rows of sense amplifiers 11a and 11b attached to the memory mat 10a at the left end are used as the sense amplifier caches. The rows of sense amplifiers 11a and 11b are both used as the sense amplifier caches, which are in a data holding state. However, since the left side row of sense amplifiers 11a is not shared, it can be connected only to the bit lines BL of the memory mat 10a through the switch unit 12a.

Figure 16:
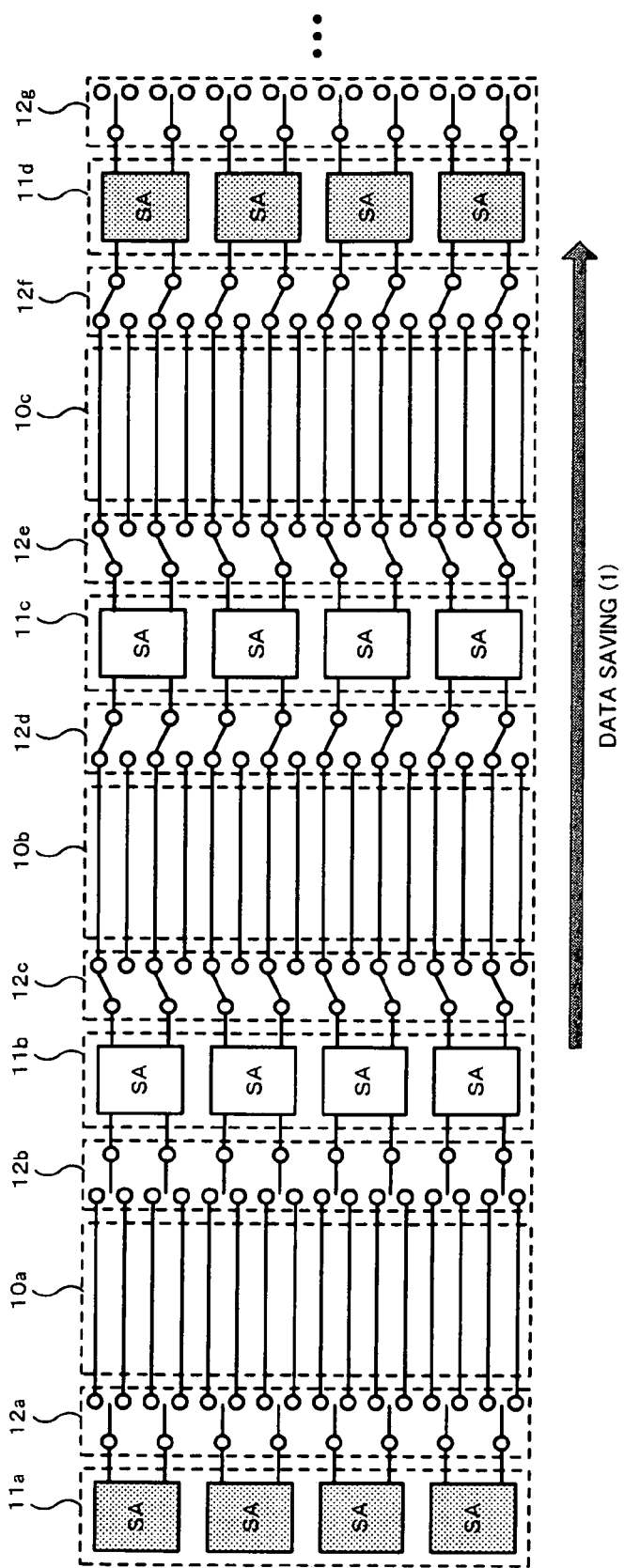
FIG. 16 is a connection state diagram subsequent to FIG. 15 when a first transfer path of the stored data in the sense amplifier cache is formed for the rows of the memory mat on the right side of the memory mat and saved the data through the first transfer path.

As shown in a connection state diagram of FIG. 16, switching operation for forming a first transfer path from the row of sense amplifiers 11b leading to the row of sense amplifiers 11d through the switch unit 12c, the memory mat 10b, the switch unit 12d, the row of sense amplifiers 11c, the switch unit 12e, the memory mat 10c and the switch unit 12f. Then, the stored data is transferred through the first transfer path, and thereby the stored data in the row of sense amplifiers 11b as the sense amplifier cache is saved in the row of sense amplifiers 11d (step S19).

Subsequently, as shown in a connection state diagram of FIG. 17, switching operation for forming a second transfer path from the row of sense amplifiers 11a at the left end leading to the row of sense amplifiers 11c through the switch unit 12a, the memory mat 10a, the switch unit 12b, the row of sense amplifiers 11b, the switch unit 12c, the memory mat 10b and the switch unit 12d. Then, the stored data is transferred through the second transfer path, and thereby the stored data in the row of sense amplifiers 11a as the sense amplifier cache is saved in the row of sense amplifiers 11c (step S20).

Figure 18:
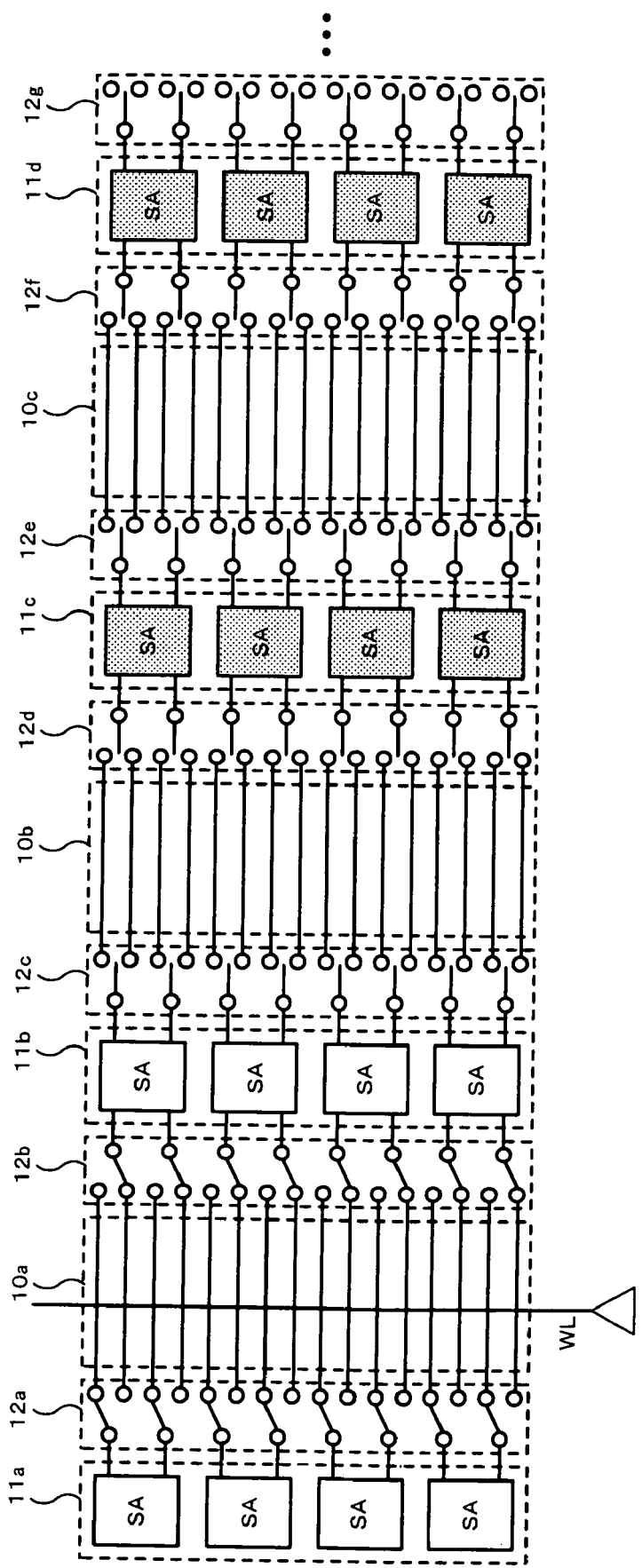
FIG. 18 is a connection state diagram subsequent to FIG. 17 when performing the refresh operation for the memory mat to be refreshed.

Next, as shown in a connection state diagram of FIG. 18, the refresh operation for the word line WL of the memory mat 10a is performed (step S21). Thereby, the selected word line WL is refreshed. Then, as shown in connection state diagrams of FIGS. 19 and 20, the write back of data in the sense amplifier cache is performed in two steps.

Figure 17:
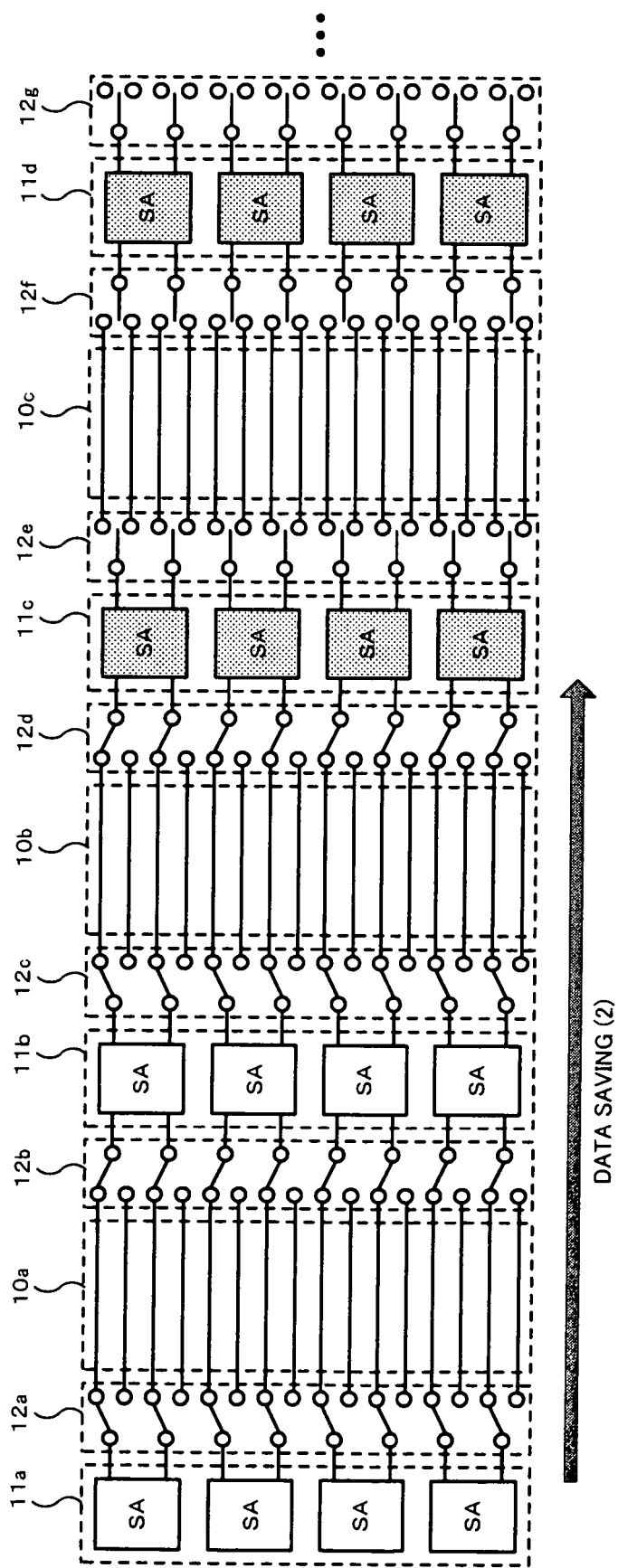
FIG. 17 is a connection state diagram subsequent to FIG. 16 when a second transfer path of the stored data in the sense amplifier cache is formed for the rows of the sense amplifiers on the left side of the memory mat and saved the data through the second transfer path.
Figure 19:
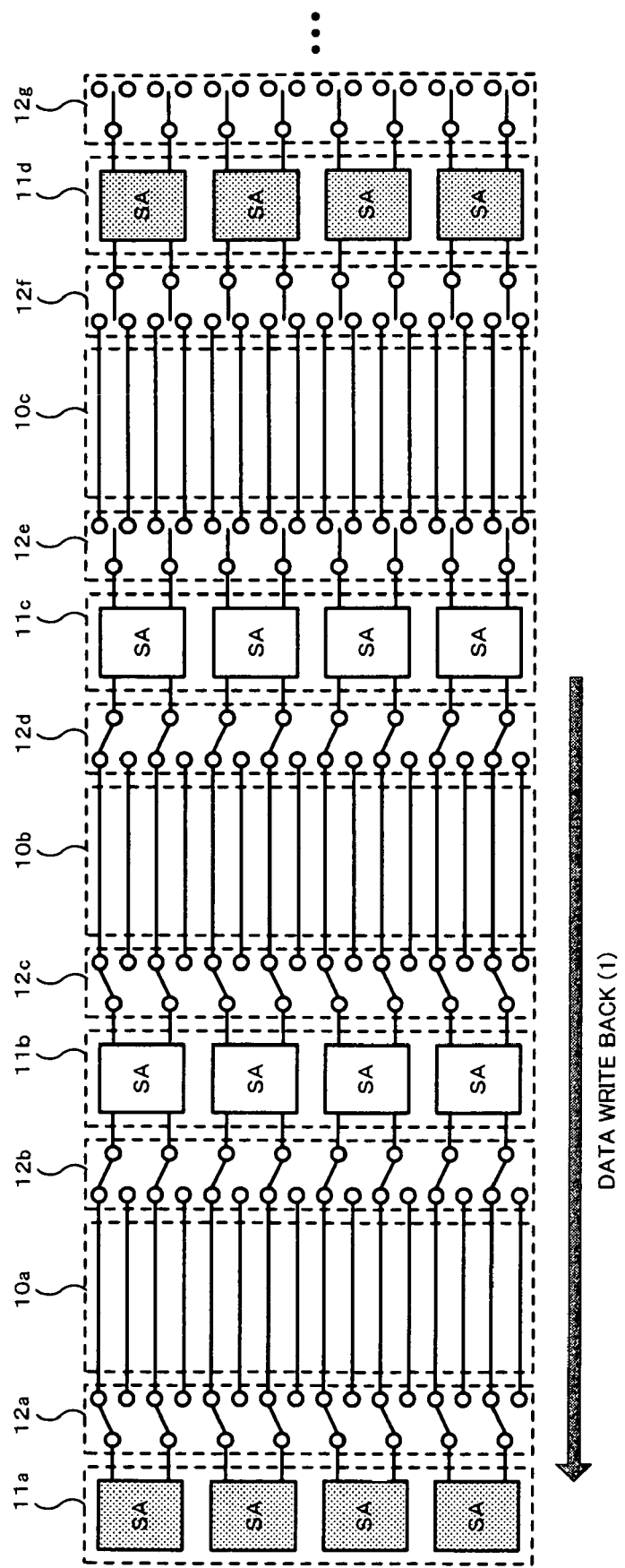
FIG. 19 is a connection state diagram subsequent to FIG. 18 when writing back the stored data from the row of sense amplifiers as the saving destination into the row of sense amplifiers on the left side of the memory mat through the second transfer path.
Figure 20:
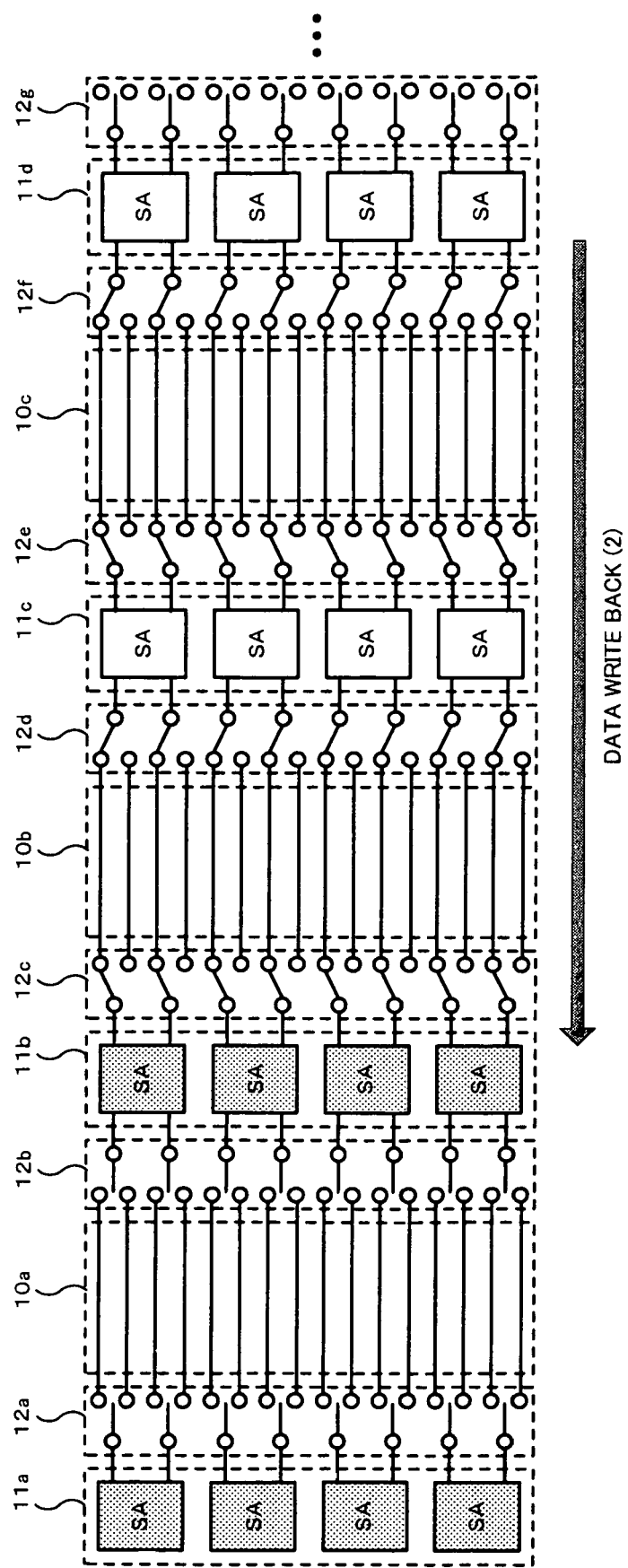
FIG. 20 is a connection state diagram subsequent to FIG. 19 when writing back the stored data from the row of sense amplifiers as the saving destination into the row of sense amplifiers on the right side of the memory mat through the first transfer path.

First, as shown in a connection state diagram of FIG. 19, the stored data in the row of sense amplifiers 11c as the saving destination is written back into the row of sense amplifiers 11a as the saving source through the second transfer path of FIG. 17 in reverse direction (step S22). Then, as shown in a connection state diagram of FIG. 20, the stored data in the row of sense amplifiers 11d as the saving destination is written back into the row of sense amplifiers 11b as the saving source through the first transfer path of FIG. 16 in reverse direction (step S23). In this manner, since the two transfer paths are overlapped in the process of steps S19 to S23, the saving and the write back should be performed both in two steps, and it is a feature that the transfer is made through the three memory mats 10.

In addition, the case in which both the row of sense amplifiers 11 attached to the memory mat 10 to be refreshed are used as the sense amplifier caches has been described using the flowchart of FIG. 9. However the first embodiment is applicable to a case in which only one row of sense amplifiers 11 attached to the memory mat 10 is used as the sense amplifier cache. In this case, the saving and the write back may be performed through one transfer path on the side of the one row of sense amplifiers 11 in the process of steps S16 to S18 or steps S19 to S23.

Further, regarding the memory mats 10 at the both ends, a control without the saving and the write back in refresh operation can be selected. If the number of the memory mats 10 is large, the process of steps S16 to S18 are applied to most of the memory mats 10, and thus the control without the saving and write back for the memory mats 10 at the both ends may be employed.

Next, two modifications of the first embodiment will be described. In a first modification, regarding the memory mats 10a and 10d at the both ends of the memory cell array, a wiring pattern including a plurality of wires for connecting the left side row of sense amplifiers 11a and the right side row of sense amplifiers 11e for each sense amplifier SA, and the saving and write back in refresh operation is performed through this wiring pattern. FIG. 21 to FIG. 24 show connection state diagrams corresponding to FIG. 11 to FIG. 14 in the first modification, and description will be made for a case of selecting the memory mat 10a at the left end to be refreshed, as in FIG. 15 to FIG. 20.

Figure 21:
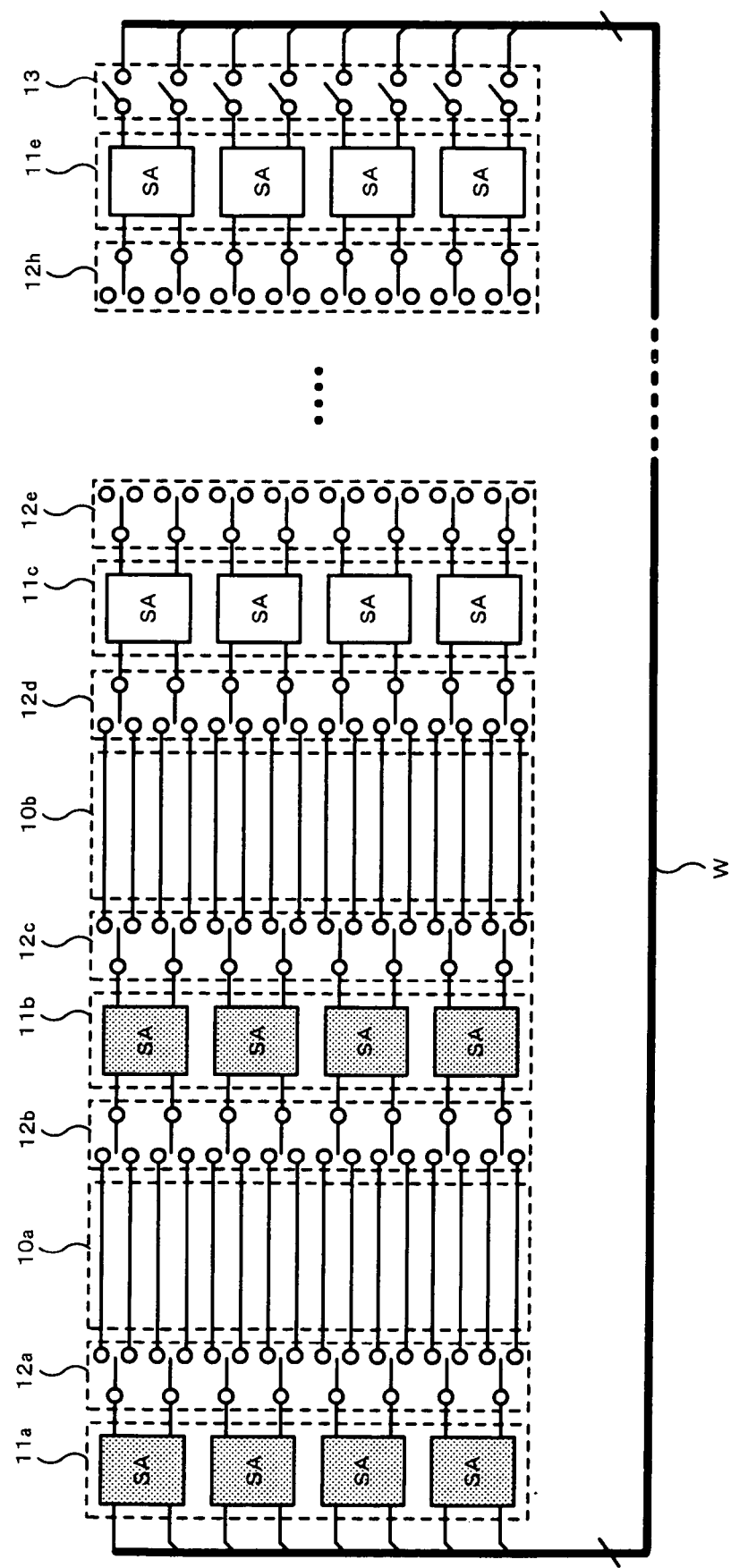
FIG. 21 is a connection state diagram corresponding to FIG. 11 in which a wiring pattern for connecting the row of sense amplifiers at the left end and the row of sense amplifiers at the right end and a switch unit are provided in a first modification of the first embodiment.

As shown in a connection state diagram of FIG. 21, the row of sense amplifiers 11a at the left end and the row of sense amplifiers 11e at the right end are connected by a wiring pattern W including a plurality of wires connected in parallel, in which corresponding sense amplifiers SA are connected through each corresponding bit line BL. This wiring pattern W can be formed, for example, on an upper wiring layer above a wiring layer for the bit lines BL of the respective memory mats 10a to 10d. Further, a switch unit 13 for switching connection between each wire of the wiring pattern W and each sense amplifier SA of the row of sense amplifiers 11e is provided.

By comparing the configuration of FIG. 21 with that of FIG. 15 in the first embodiment, it is clear that the row of sense amplifiers 11a at the left end and the row of sense amplifiers 11e at the right end are connected through each corresponding bit line BL by each wire of the wiring pattern W, and this connection state can be controlled to be on/off by the switch unit 13. Therefore, a configuration in which four memory mat 10 are connected in a ring shape can be realized, and data in the memory mat 10a to which the rows of sense amplifiers 11a and 11b used as the sense amplifier caches are attached can be transferred to the left side, which is different from FIG. 15.

Figure 22:
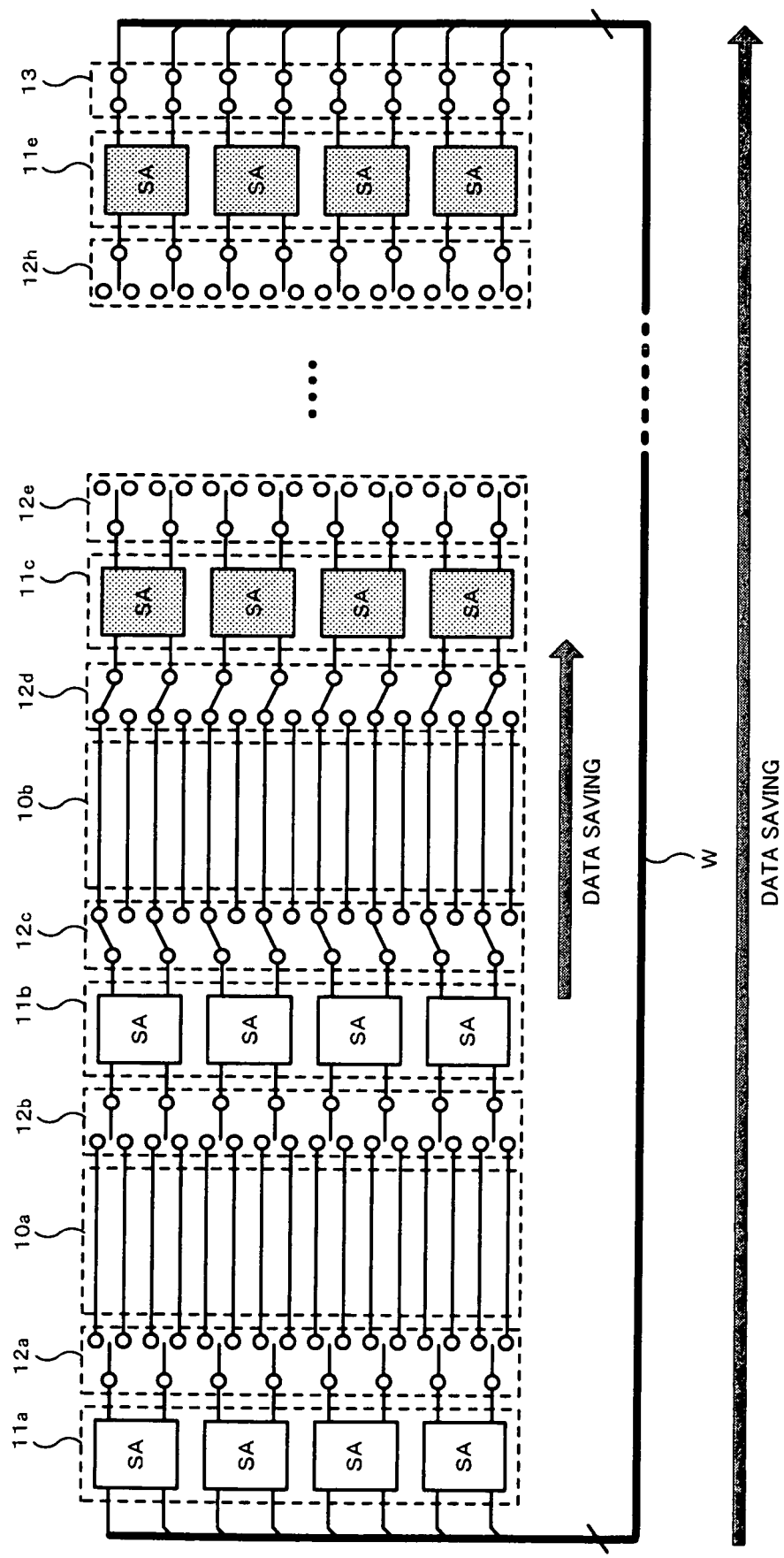
FIG. 22 is a connection state diagram subsequent to FIG. 21 when forming a transfer path for stored date in the sense amplifier cache regarding two rows of sense amplifiers attached to the memory mat at the left end.

FIG. 22 is a connection state diagram showing data saving operation of the rows of sense amplifiers 11a and 11b used as the sense amplifier caches. For the row of sense amplifiers 11b on the right side of the memory mat 10a, a transfer path leading to the row of sense amplifiers 11c through the switch unit 12c, the memory mat 10b and the switch unit 12d is formed. On the other hand, for the row of sense amplifiers 11a on the left side of the memory mat 10a, a transfer path leading to the row of sense amplifiers 11e at the right end through the wiring pattern W and the switch unit 13 being on. By transferring data through these two transfer paths at the same time, the data saving in the rows of sense amplifiers 11c and 11e is completed.

Figure 23:
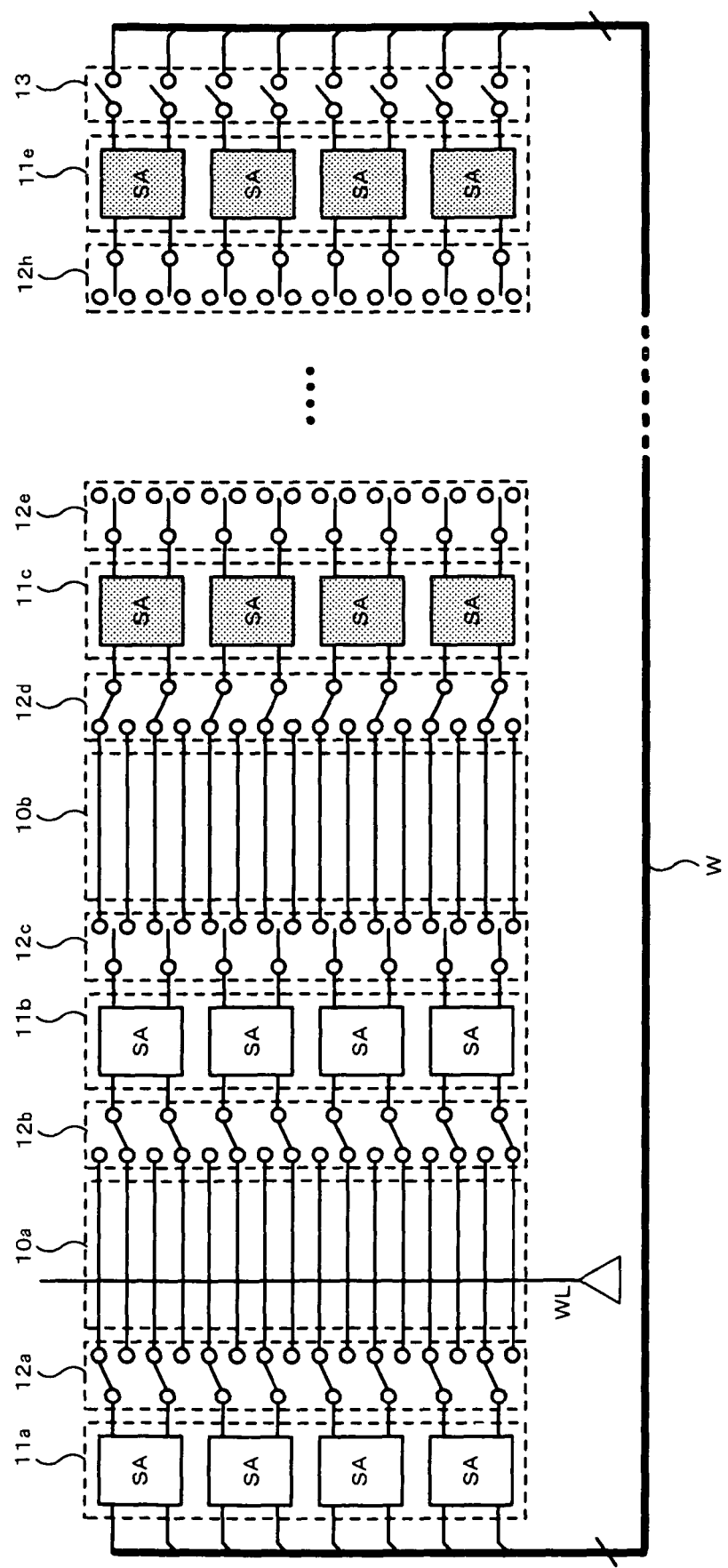
FIG. 23 is a connection state diagram subsequent to FIG. 22 when performing the refresh operation for the memory mat to be refreshed.
Figure 24:
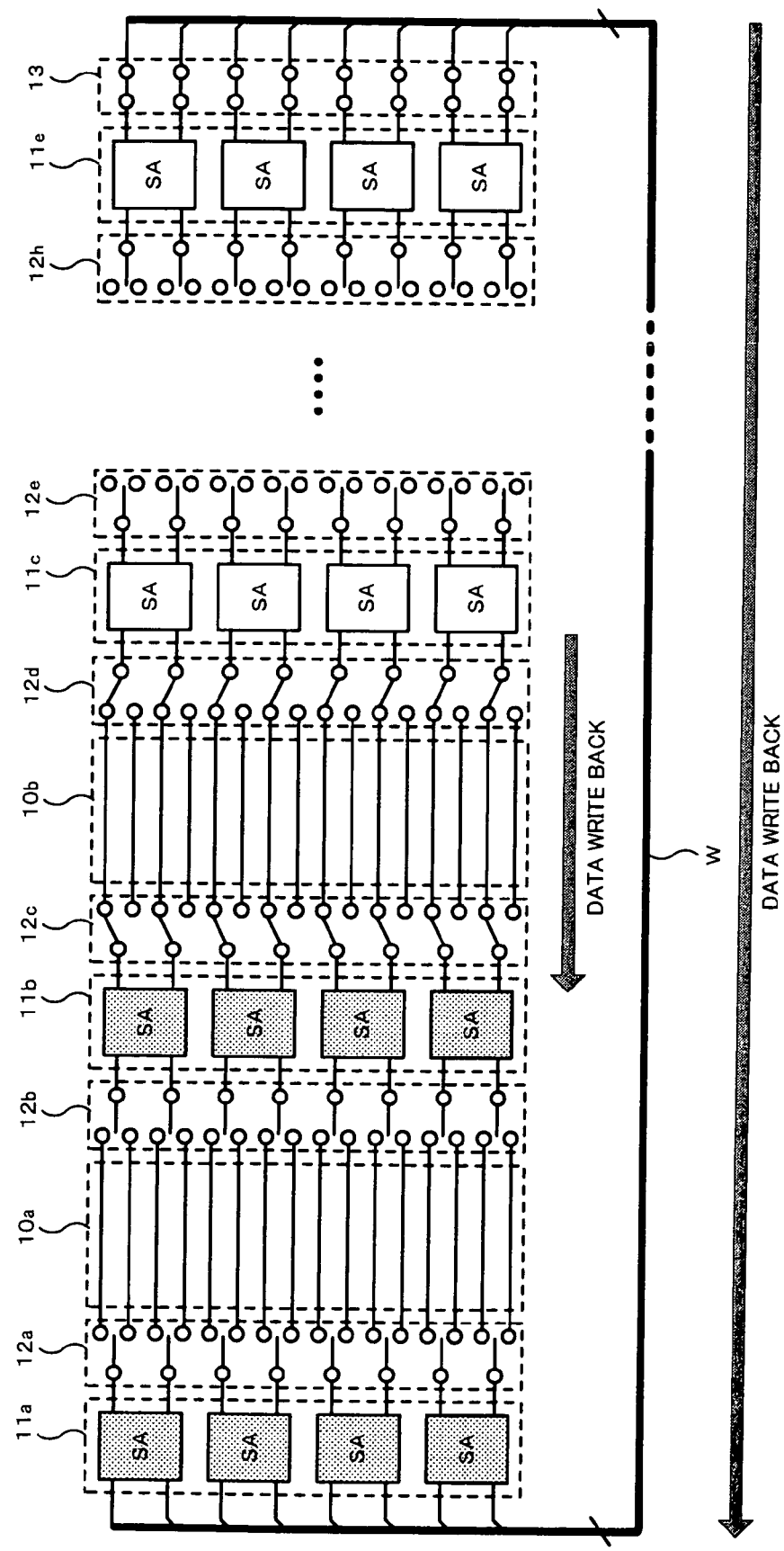
FIG. 24 is a connection state diagram subsequent to FIG. 23 when writing back the stored data from the row of sense amplifiers as the saving destination to the row of sense amplifiers as the saving source.

FIG. 23 is a connection state diagram when performing the refresh operation for the word line WL of the memory mat 10a to be refreshed. The refresh operation in this case is performed in the same process as in FIGS. 13 and 18. Further, FIG. 24 is a connection state diagram of write back operation in which the stored date is written back from the rows of sense amplifiers 11c and 11e as the saving destinations into the rows of sense amplifiers 11a and 11b as the saving sources. The transfer path in this case is reverse to the two transfer paths shown in FIG. 22. In this manner, by providing the wiring pattern W serving as a data transfer path in the first modification, the saving and the write back of the stored data in the memory mats 10a and 10d can be performed by a relatively simple process.

Next, in a second modification of the first embodiment, a row of sense amplifiers for saving used exclusively for the stored data in the two rows of sense amplifiers 11a and 11e is provided. FIGS. 25 to 28 show connection state diagrams corresponding to FIGS. 11 to 14 in the second modification, and a case in which the memory mats 10a at the left end is to be refreshed will be described as in the first modification.

Figure 25:
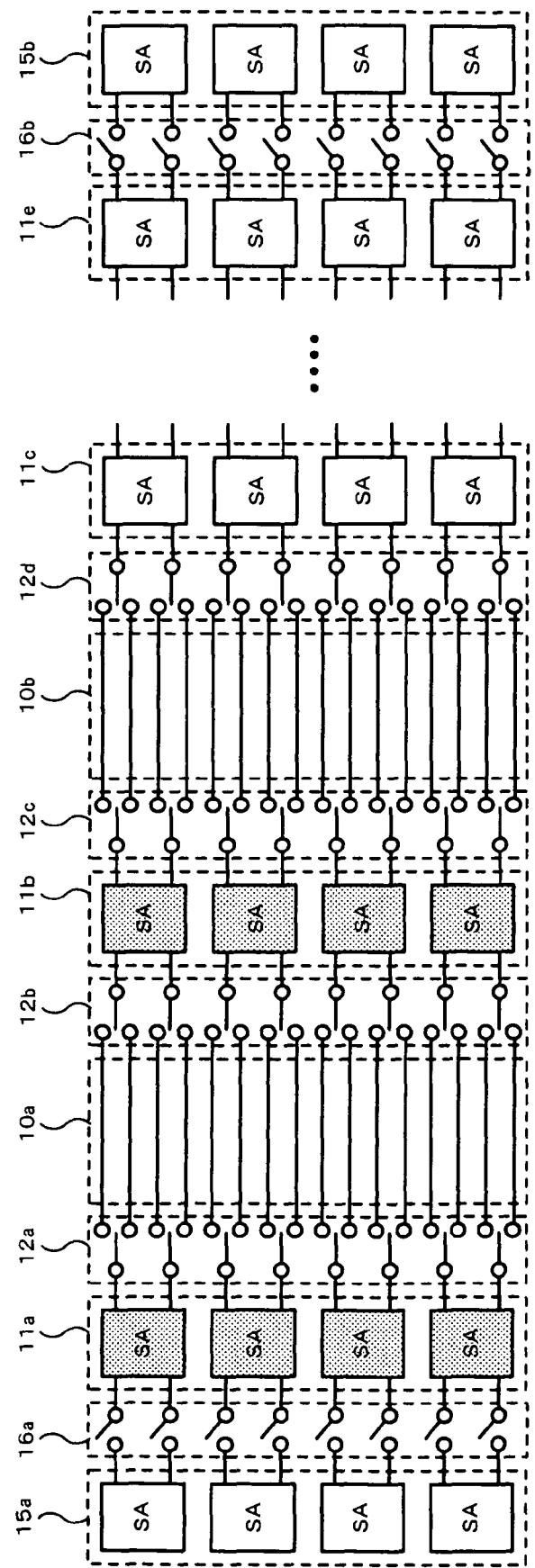
FIG. 25 is a connection state diagram corresponding to FIG. 11 having a row of sense amplifiers for saving in which stored data in tow rows of sense amplifiers at both ends is saved.

As shown in a connection state diagram of FIG. 25, rows of sense amplifiers for saving 15a and 15b are arranged at the both ends of the memory cell array, and there are provided a switch unit 16*a* for switching connection between the left side row of sense amplifiers for saving 15*a* and the row of sense amplifiers 11*a*, and a switch unit 16*b* for switching connection between the right side row of sense amplifiers for saving 15*b* and the row of sense amplifiers 11*e*. These rows of sense amplifiers for saving 15*a* and 15*b* are used to save the stored data when the rows of sense amplifiers 11*e* and 11*e* attached to the memory mats 10*a* and 10*d* at the both ends are used as the sense amplifier caches.

Figure 26:
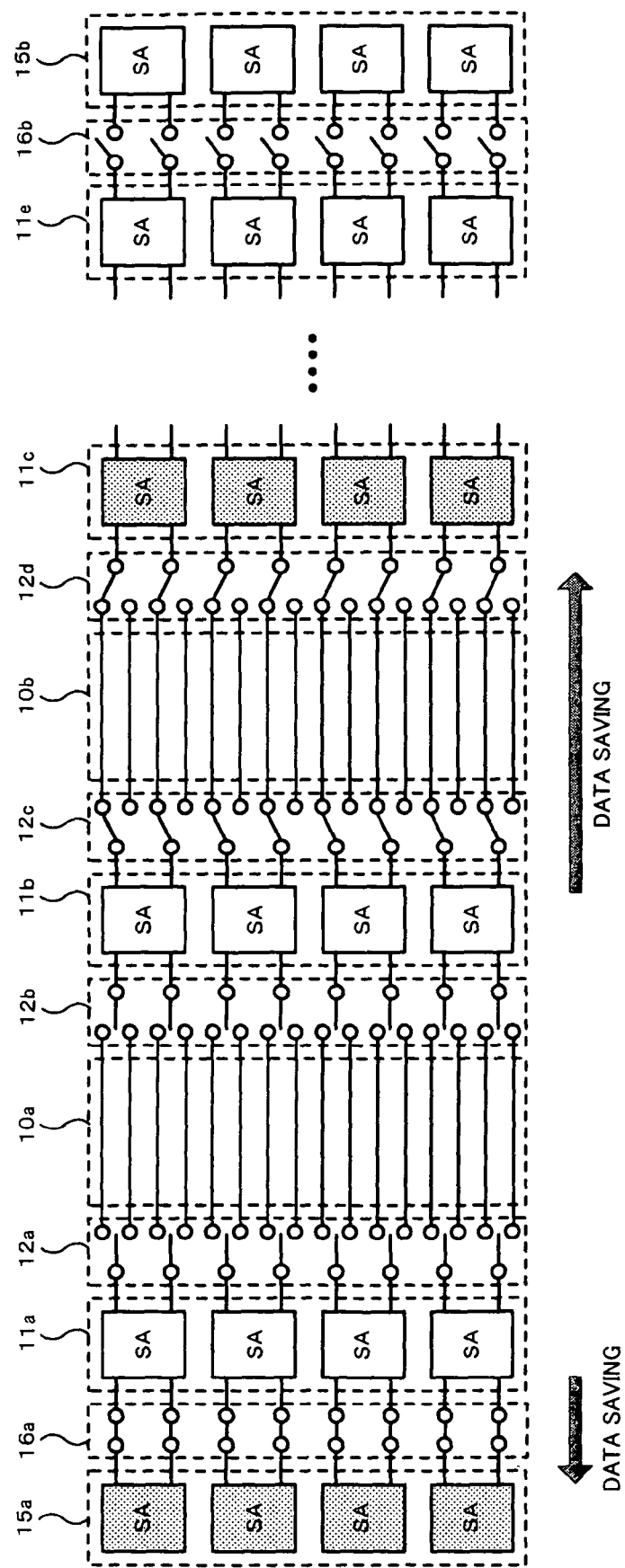
FIG. 26 is a connection state diagram subsequent to FIG. 25 when a transfer path of the stored data in the sense amplifier cache is formed for two rows of the memory mat attached to the memory mat at the left end is formed and the stored data is saved through the transfer path.

FIG. 26 is a connection state diagram showing data saving operation of the rows of sense amplifiers 11*a* and 11*b* attached to the memory mat 10*a*. Regarding the row of sense amplifiers 11*b* on the right side of the memory mat 10*a*, a transfer path leading to the row of sense amplifiers 11*c* is formed as in FIG. 22. On the other hand, regarding the row of sense amplifiers 11*a* on the left side of the memory mat 10*a*, a transfer path leading to the row of sense amplifiers for saving 15*a* through the switch unit 16*a* being on is formed. By transferring data through these two transfer paths at the same time, data saving to the row of sense amplifiers 11*c* and the row of sense amplifiers for saving 15*a* is completed.

Figure 27:
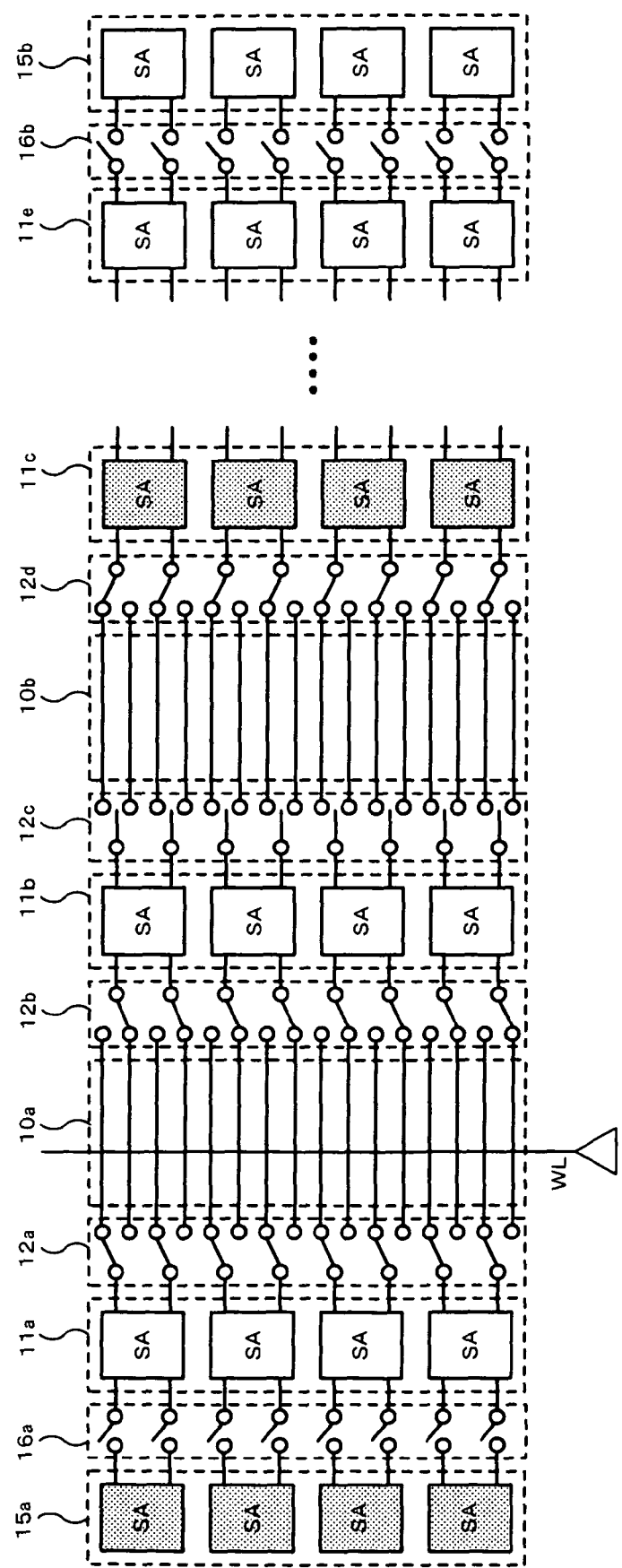
FIG. 27 is a connection state diagram subsequent to FIG. 26 when performing the refresh operation for the memory mat to be refreshed.
Figure 28:
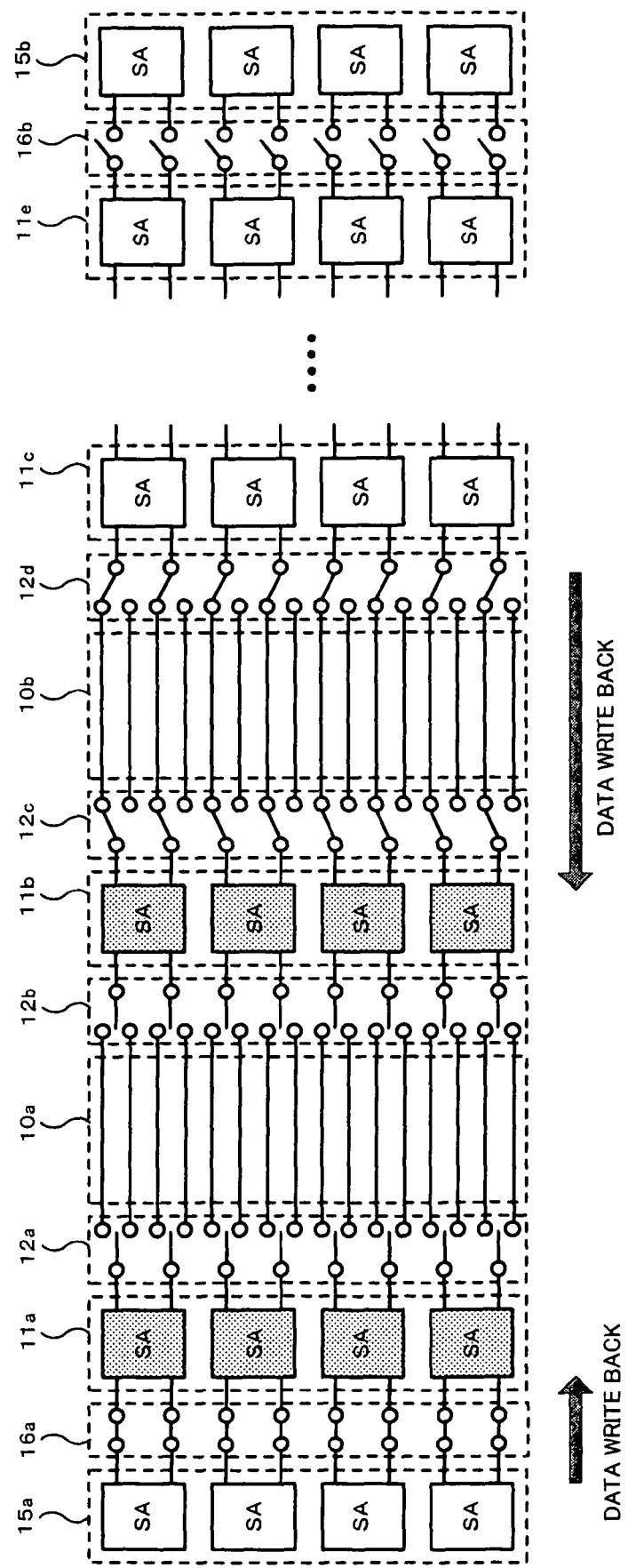
FIG. 28 is a connection state diagram subsequent to FIG. 27 when writing back the stored data from the row of sense amplifiers as the saving destination to the row of sense amplifiers as the saving source.

FIG. 27 is a connection state diagram when performing the refresh operation for the word line WL of the memory mat 10*a* to be refreshed. The refresh operation in this case is performed in the same process as in FIG. 13 of the first modification. Further, FIG. 28 is a connection state diagram showing the write back operation from the row of sense amplifiers 11*c* as the saving destination and the row of sense amplifiers for saving 15*a* into the rows of sense amplifiers 11*a* and 11*b* as the saving sources. The transfer path in this case is reverse to the two transfer paths shown in FIG. 26. When the controls corresponding to FIGS. 25 to 28 are applied to the right side memory mat 10*d*, symmetrical operation can be assumed. In this manner, in the second modification, chip area for the rows of sense amplifiers for saving 15*a* and 15*b* and the switch units 16*a* and 16*b* is required, but a region or a wiring layer for forming the above-mentioned wiring pattern w is not required.

Second Embodiment

Figure 29:
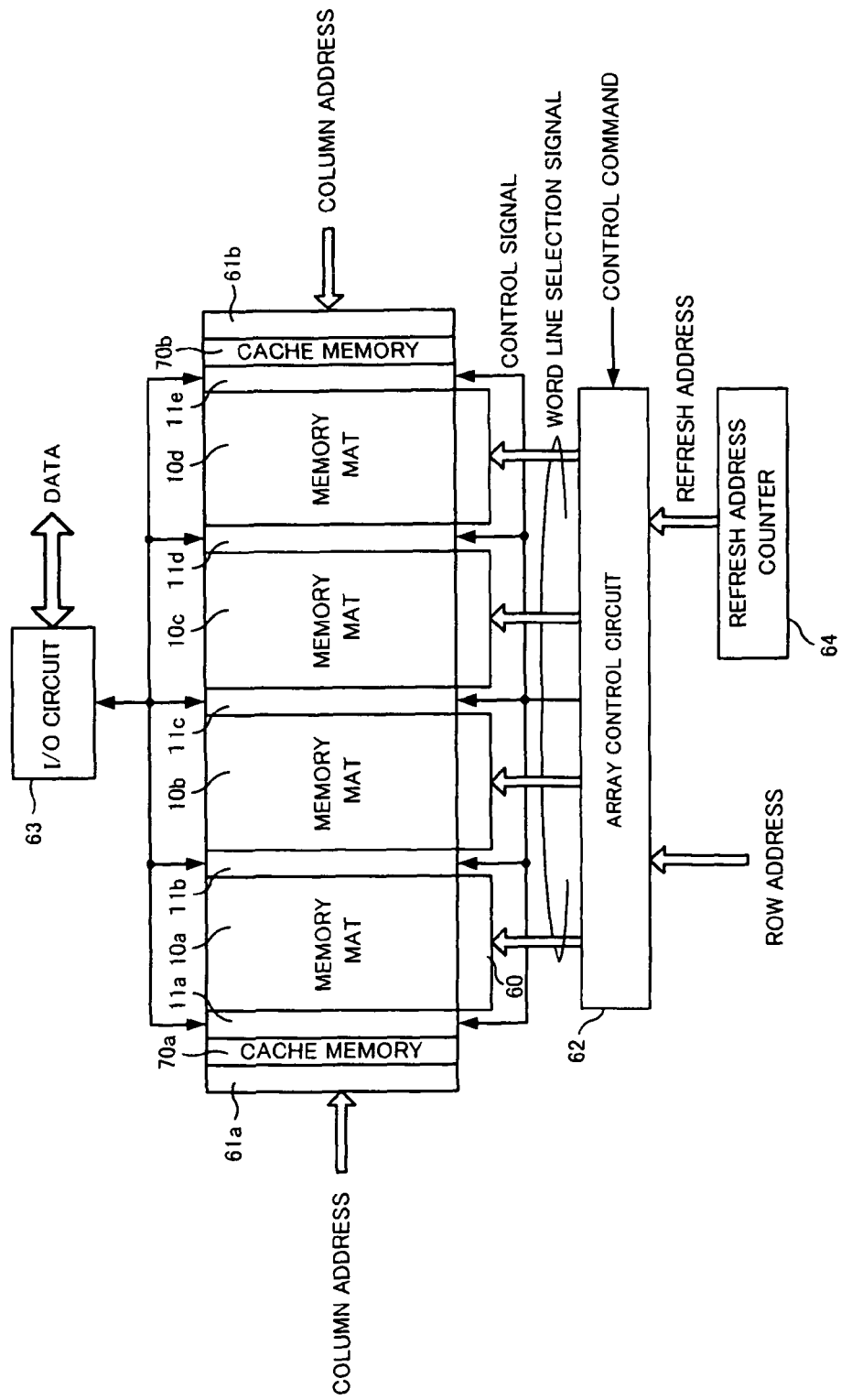
FIG. 29 is a block diagram showing a schematic configuration of a DRAM of a second embodiment.

A second embodiment of the present invention will be described. The configuration shown in FIGS. 1 to 7 of the first embodiment is common to a DRAM of the second embodiment, so description thereof will be omitted. Meanwhile, a block diagram of FIG. 29 shows a schematic configuration of the DRAM of the second embodiment. By comparing the configuration of FIG. 29 with that of FIG. 8, a difference exists in that special purpose cache memories 70*a* and 70*b* attached to the memory cell array are provided. That is, the cache memory 70*a* between the row of sense amplifier 11*a* and one column decoder 61*a* is provided at the left side of FIG. 29, while the cache memory 70*b* between the row of sense amplifier 11*e* and the other column decoder 61*b* is provided at the right side of FIG. 29. Thus, the five rows of sense amplifiers 11*a* to 11*e* are not used as the cache memories in the second embodiment. Moreover, other elements in the configuration are common to those in FIG. 8.

Figure 30:
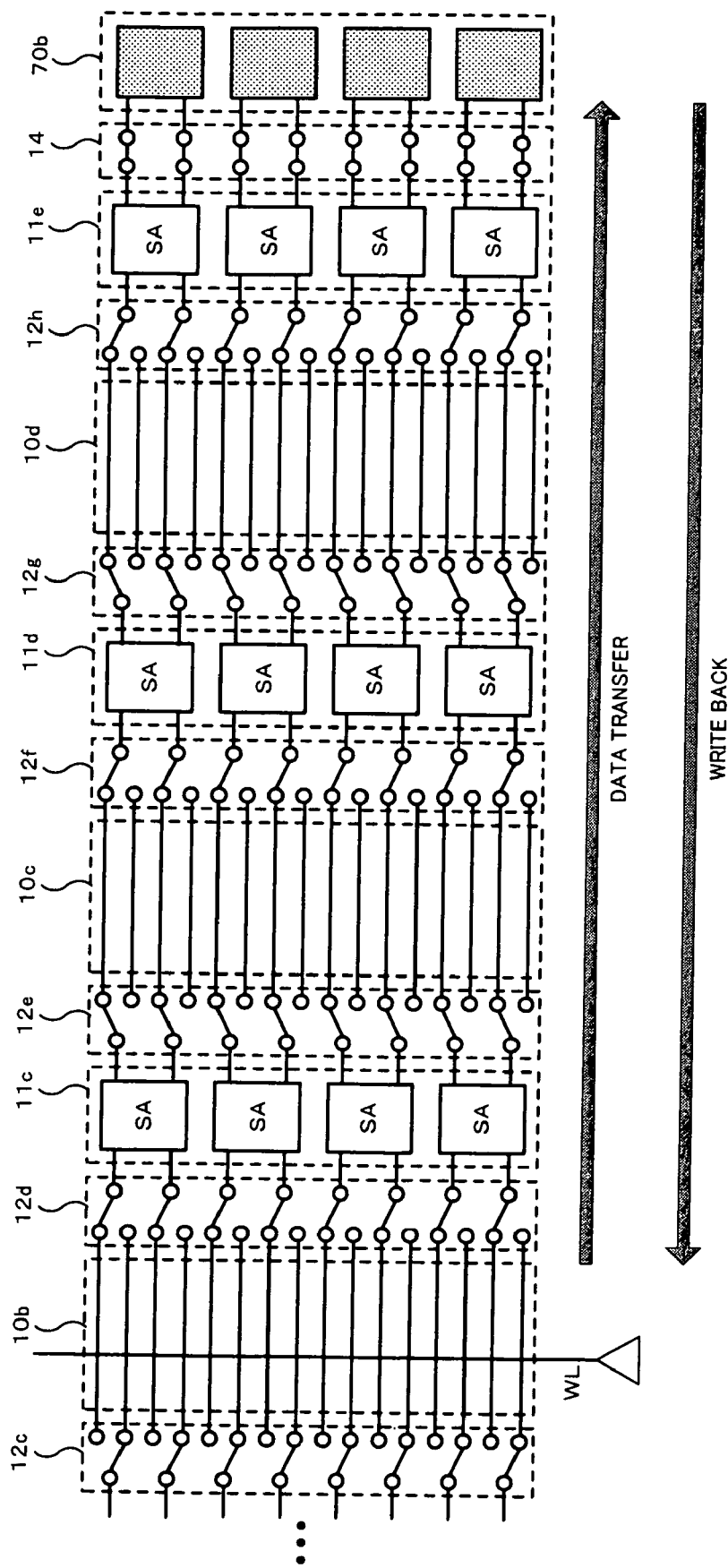
FIG. 30 is a connection state diagram showing transfer operation from the memory mat to the cache memory when reading data in the second embodiment.

FIG. 30 is a connection state diagram showing transfer operation to the cache memories 70*a* and 70*b* in reading in the second embodiment. As shown in FIG. 30, it is assumed that a predetermined word line WL of the memory mat 10*b* at the third position from the right of FIG. 8 is selected to be read. A switch unit 14 for switching connection between the memory mat 10*d* at the right end and the cache memory 70*b* is provided therebetween. When reading the selected word line WL, a transfer path leading to the right which sequentially connects the odd number bit lines BL1 and BL3 of the memory mats 10*b*, 10*c* and 10*d* is formed by controlling the switch units 12*d*, 12*e*, 12*f*, 12*g*, 12*h* and 14. Although the right side of the memory mat 10*b* is shown in FIG. 30, a transfer path leading to the left which sequentially connects the even number bit lines BL2 and BL4 of the memory mats 10*b* and 10*a* is also formed (not shown).

Thereby, half of read data from the memory cells MC on the selected word line WL of the memory mat 10*b* is transferred to the cache memory 70*b* through the transfer path leading to the right. Further, remaining half of the read data is transferred to the cache memory 70*a* through the transfer path leading to the left.

In the second embodiment, write back operation passing through the same transfer path as in the above-mentioned transfer operation can be performed (represented by an arrow reverse to the transfer path in FIG. 30). In the write back operation, data of the cache memories 70*a* and 70*b* are written back into the memory cells MC on the selected word line WL through the transfer path in reverse direction in response to a write back request. As shown in FIG. 30, the transfer operation and the write back operation are performed in the same connection state. In the example of FIG. 30, since half of data is written back from the cache memory 70*b* for the selected word line WL of the memory mat 10*b*, the remaining half of data can be written back by performing the same write back operation for the cache memory 70*a*.

Figure 31:
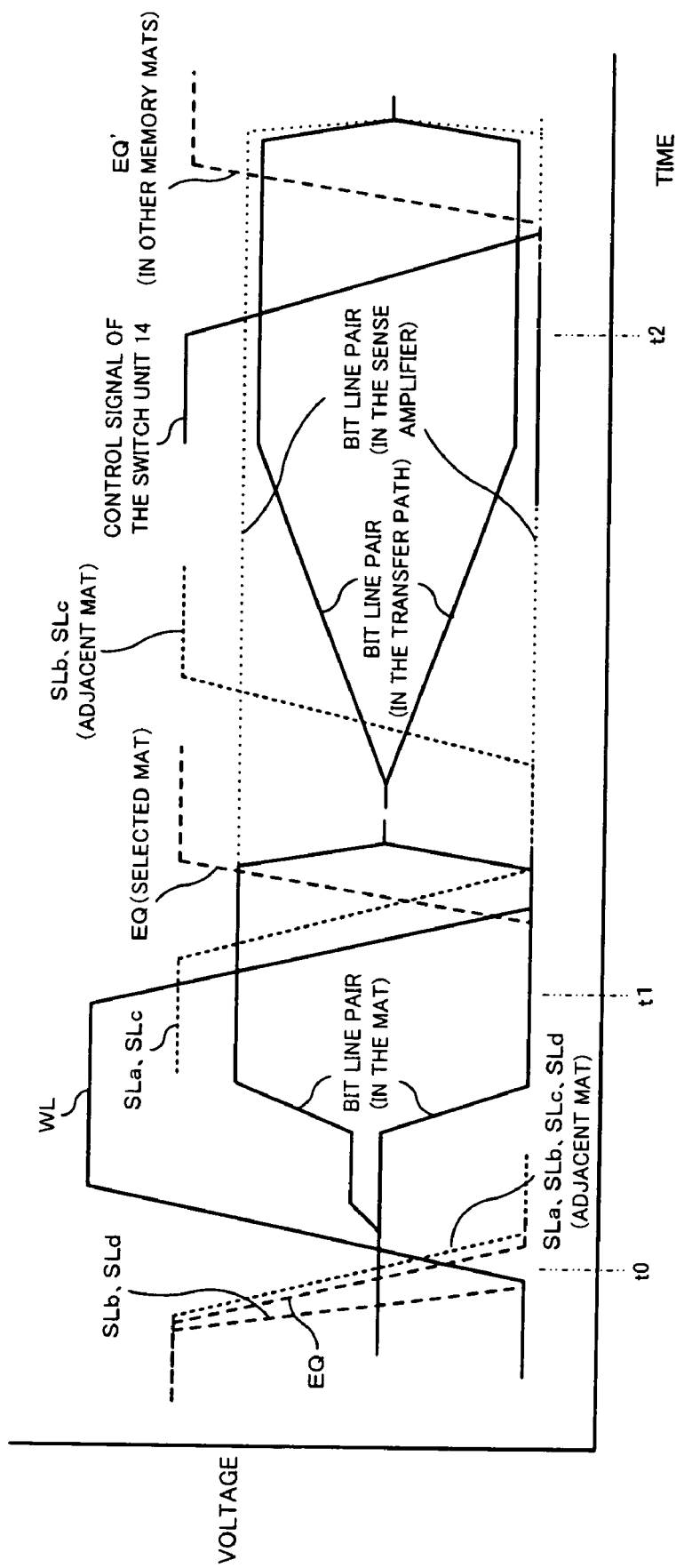
FIG. 31 is a diagram showing signal waveforms corresponding to the transfer operation of FIG. 30.

FIG. 31 shows signal waveforms corresponding to the transfer operation of FIG. 30. At a timing t0 of FIG. 31, a bit line equalize signal EQ for the memory mat 10*b* falls from high to low, thereby shifting from pre-charge operation to read operation. At this point, select control lines SLb and SLd for the memory mat 10*b* fall so that the switch units 12*c* and 12*d* are switched to the connection state in FIG. 30, and the selected word line WL goes high and activated. Thereby, the memory cells MC on the selected word line WL of the memory mat 10*b* are read out, a signal level of each bit line pair is amplified from a minute level at the initial point by the sense amplifier SA.

At a subsequent timing t1, the selected word line WL goes low and is non-activated, and select control lines SLa and SLc of the memory mat 10*b* fall so that the switch units 12*c* and 12*d* of FIG. 30 are disconnected. Then, the bit line equalize signal EQ for the memory mat 10*b* rises, thereby shifting to the pre-charge operation again and each bit line pair of the memory mat 10*b* is pre-charged.

Subsequently, select control lines SLb and SLc of the memory mats 10*c* and 10*d* included in the transfer path rise, and the switch units 12*e*, 12*f*, 12*g* and 12*h* are switched to the connection state in FIG. 30. Thereby, a signal level of each bit line pair in the memory mats 10*c* and 10*d* is gradually increased from a pre-charge level. Wire length of each bit line pair in the transfer path is long enough to increase capacitance, and thus a change in signal level becomes gradual.

Herein, a control signal for the switch unit 14 of FIG. 30 remains high until a timing t2, and the switch unit 14 is on. In this state, the transfer to the cache memory 70*d* is completed. Then, the control signal for the switch unit 14 falls at the timing t2, and the switch unit 14 is switched off. Thereafter, a bit line equalize signal EQ' for the memory mats 10*c* and 10*d* in the transfer path rises thereby shifting to the pre-charge operation, and the bit lines BL of the memory mats 10*b*, 10*c* and 10*d* are pre-charged.

Figure 32:
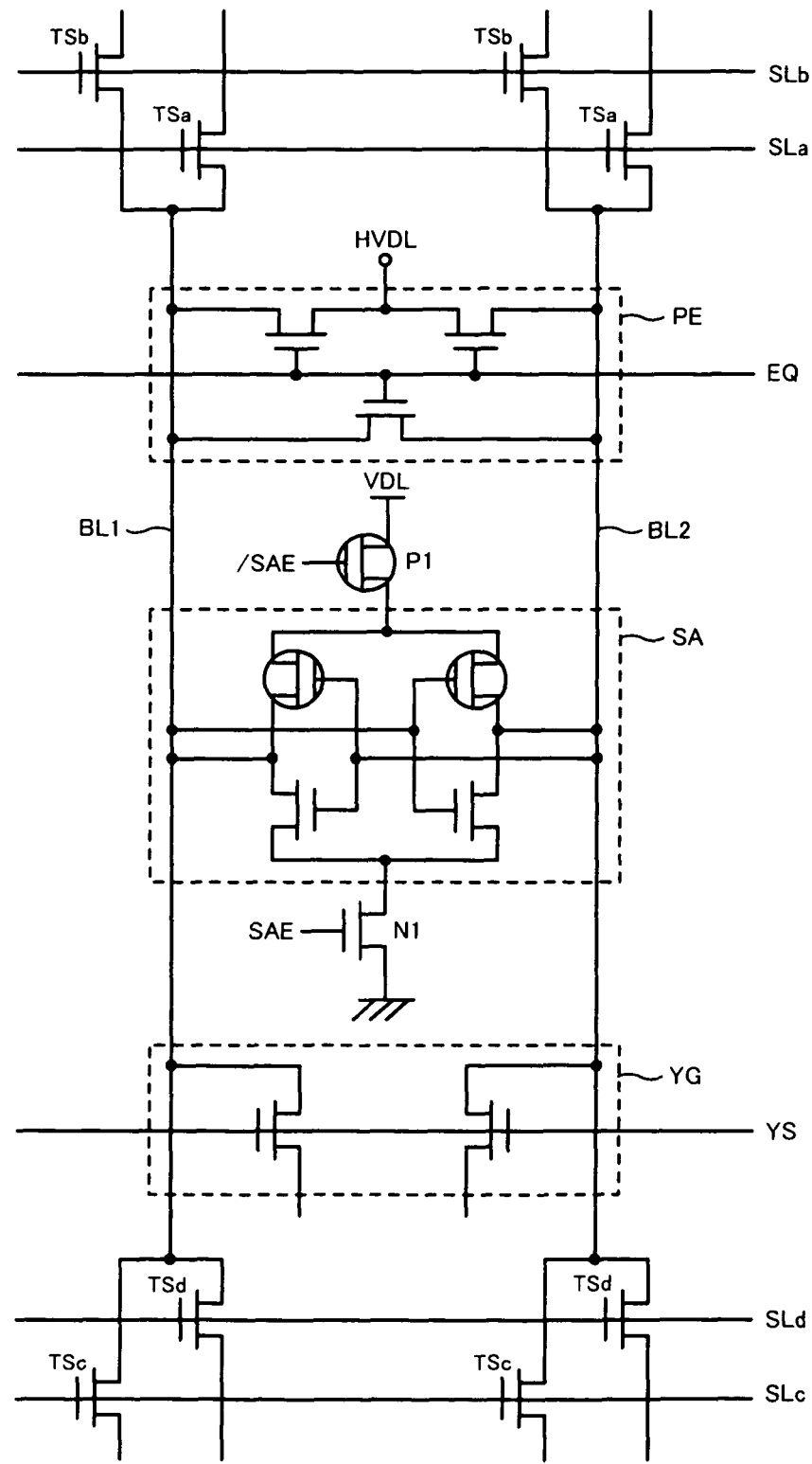
FIG. 32 is an example of a circuit configuration of a sense amplifier connected to a bit line pair and its peripheral portion.

In the above described transfer operation, each sense amplifier SA in the transfer path should be controlled to be in a non-active state. FIG. 32 shows a circuit configuration of the sense amplifier SA connected to the bit line pair BL1 and BL2 and its peripheral portion. In FIG. 32, the sense amplifier SA is composed of a pair of PMOS transistors and a pair of NMOS transistors. A power supply VDL is supplied to the sense amplifier SA through a PMOS transistor P1, and the sense amplifier SA is connected to ground through a NMOS transistor N1. A pre-charge equalize circuit PE for pre-charging/equalizing the bit line pair BL1 and BL2 based on a pre-charge power supply HVDL under the control of the bit line equalize signal EQ, and a selection gate YG for outputting data of the bit line pair BL1 and BL2 under the control of a selection line YS are provided on the periphery of the sense amplifier SA. Further, the transistor switches TSa and TSb at one end and the transistor switches TSc and TSd at the other end are arranged as the switch units 12 on the both sides of the sense amplifier SA.

In FIG. 32, the pre-charge equalize circuit PE is arranged on the bit line pair of the sense amplifier side of the transistor switches Tsa, TSb, TSc and TSd. However, the pre-charge equalize circuit PE may be arranged on the bit line pair of the memory cell side of the transistor switches.

For the sense amplifier SA included in the transfer path, a sense amplifier control signal SAE is controlled to be low, while an inverted sense amplifier control signal /SAE is controlled to be high, and thereby the PMOS transistor P1 and the NMOS transistor N1 are both turned off. By this, the sense amplifier SA is in a non-activated state, and the bit line pair BL1 and BL2 is not influenced by operation of the sense amplifier SA when the transfer path is formed.

Figure 33:
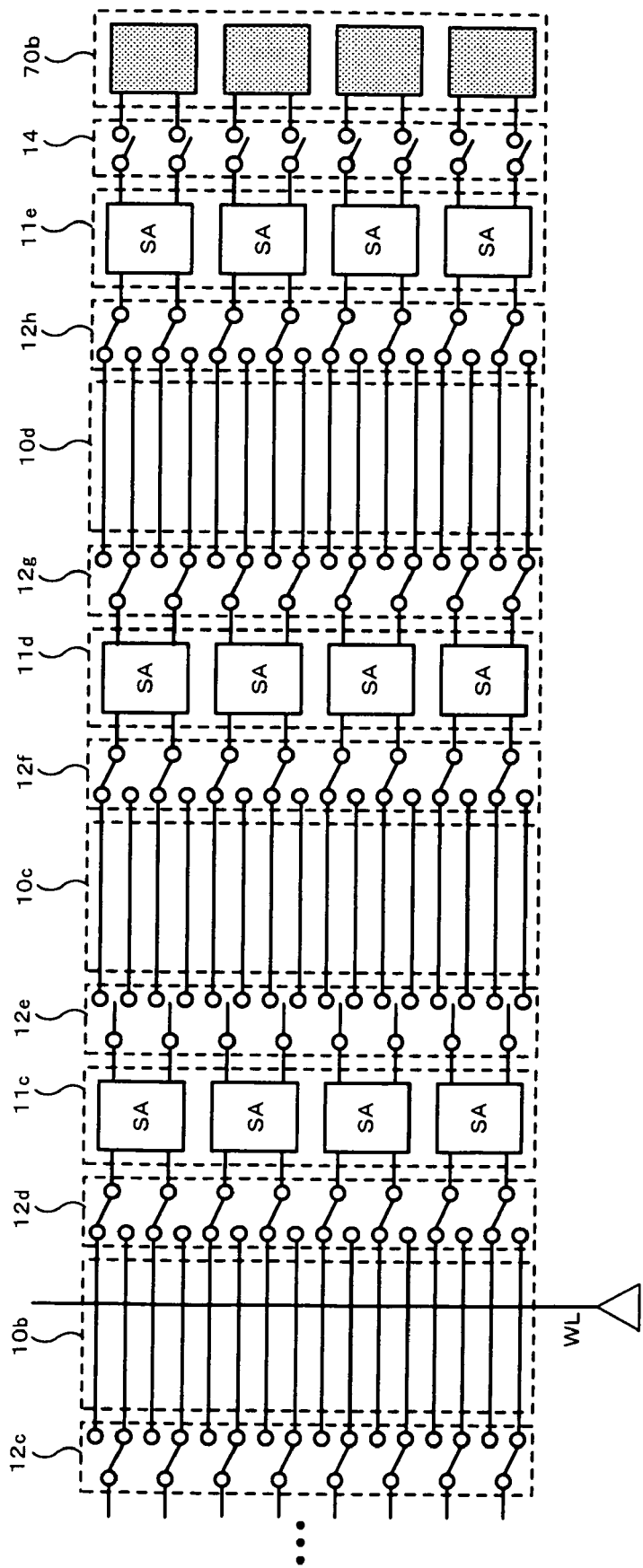
FIG. 33 is a connection state diagram subsequent to FIG. 30 when performing the refresh operation for the memory mat to be refreshed.

Next, FIG. 33 is a connection state diagram when performing the refresh operation for the word line WL of the memory mat 10b to be refreshed subsequent to FIG. 30. The refresh operation in this case is performed in the same process as in the first embodiment. At this point, the switch unit 14 on the side of the cache memory 70b is controlled to be off, and a switch unit (not shown) on the side of the cache memory 70a is also controlled to be off. If the memory mat 10a is refreshed in such a state, this does not affect the cache memories 70a and 70b, and the stored data at this point can be reliably protected.

As described above, by comparing the configuration in the second embodiment with that in the first embodiment, elements such as the cache memories 70a and 70b or the switch unit 14 are added, but the saving operation and the write back operation for the sense amplifier cache are not required to be performed in refresh operation, so that rapid control can be achieved. Meanwhile, as shown in FIG. 31, when a large number of the memory mats 10 are arranged adjacently, it is desirable that the number of the memory mats 10 included in the transfer path is in an appropriate range because a change in signal level takes time depending on the wire length.

Figure 34:
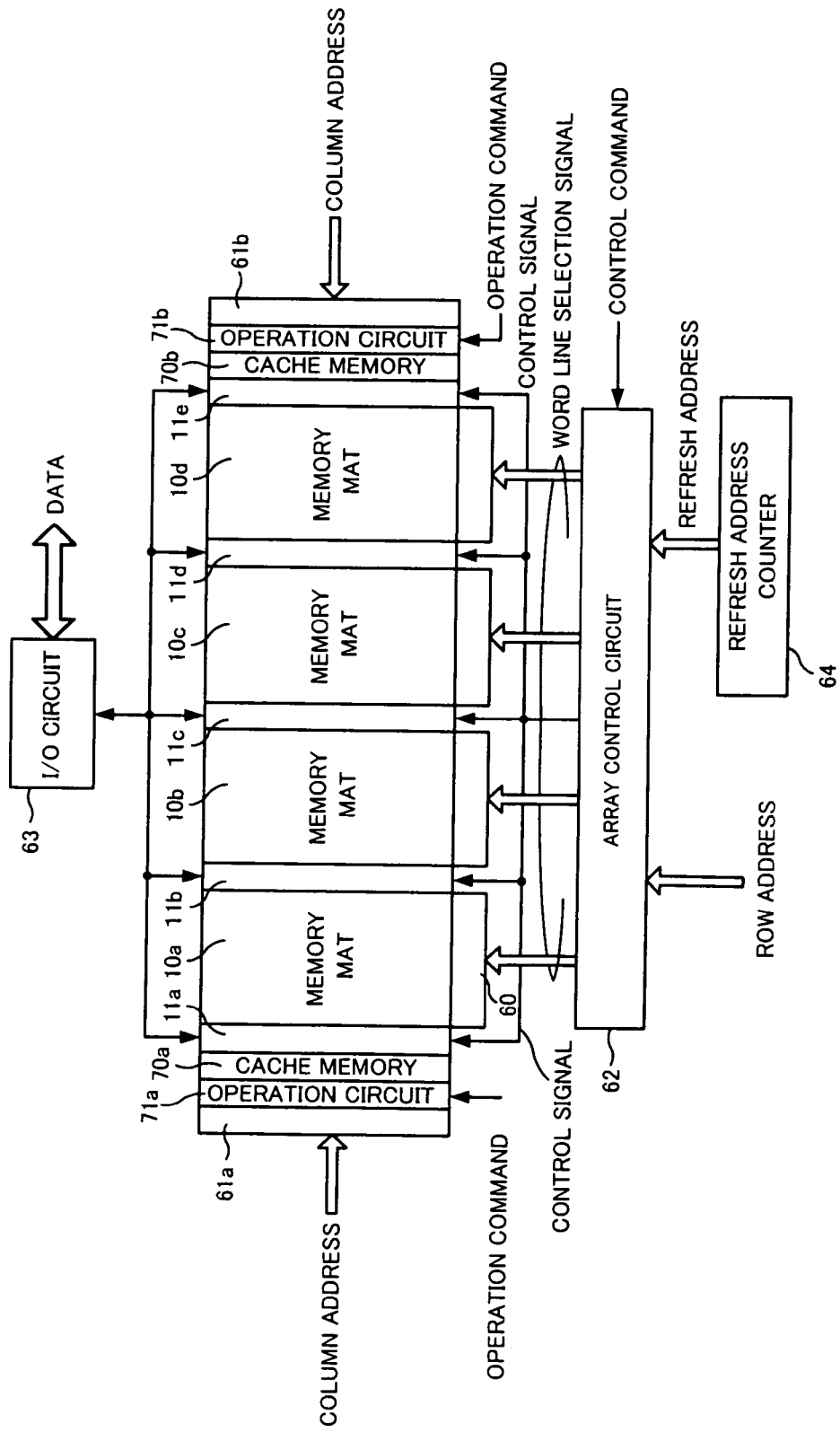
FIG. 34 is a block diagram showing a schematic configuration of a DRAM of a modification of the second embodiment.

A modification of the configuration of the second embodiment will be described. A block diagram of FIG. 34 shows a schematic configuration of the modification of the second embodiment. By comparing the configuration of FIG. 34 with that of FIG. 29, a difference exists in that an operation circuit 71a attached to the cache memory 70a and an operation circuit 71b attached to the cache memory 70b are provided. The operation circuits 71a and 71b are circuits for an operation associated with a predetermined function using the stored data in the cache memories 70a and 70b. This configuration is adequate for realizing a logic mixed memory having an operating function.

Third Embodiment

A third embodiment of the present invention will be described. In the third embodiment, the configuration and control on the basis of the first or the second embodiment can be applied, in which the row of sense amplifiers 11 is not used as the sense amplifier cache and is used for the purpose of data transfer between the rows of sense amplifiers 11 of different memory mats 10. In the following, a case in which control of the third embodiment is applied to the DRAM of the first embodiment will be described.

Figure 35:
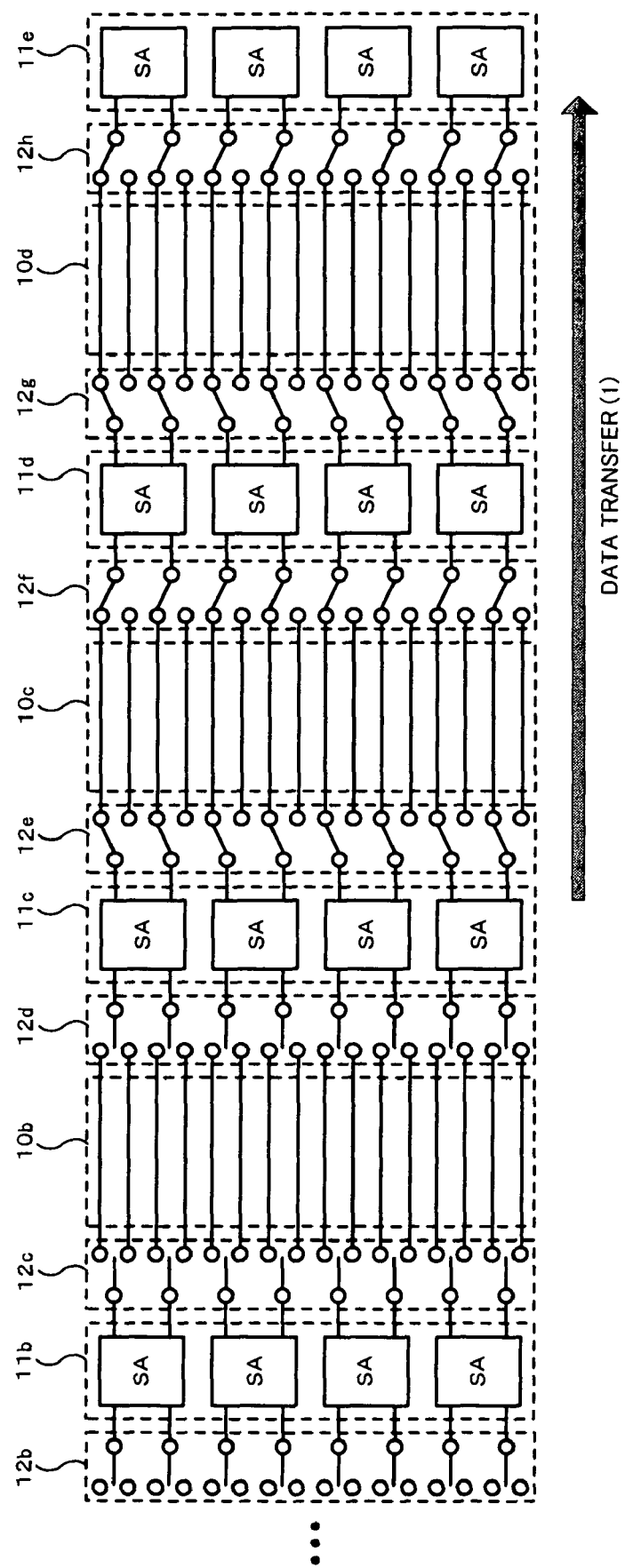
FIG. 35 is a connection state diagram when performing data transfer from the row of sense amplifiers as a copy source to the row of sense amplifiers as a copy destination through a first transfer path in a third embodiment.

FIG. 35 is a connection state diagram when performing data transfer from the memory mat 10b at the second from the left to the memory mat 10d at the right end. In FIG. 35, data of the memory cells MC on a predetermined word line WL of the memory mat 10b is assumed to be stored in the rows of sense amplifiers 11b and 11c attached to the memory mat 10b. First, switch control for forming a first transfer path from the row of sense amplifiers 11c at the right side of the memory mat 10b leading to the row of sense amplifiers 11e through the switch unit 12e, the memory mat 10c, the switch unit 12f, the row of sense amplifiers 11d, the switch unit 12g, the memory mat 10d and the switch unit 12h is performed. Then, by transferring data through the first transfer path, data of the row of sense amplifiers 11c as a copy source can be copied to the row of sense amplifiers 11e as a copy destination.

Subsequently, as shown in a connection state diagram of FIG. 36, switch control for forming a second transfer path from the row of sense amplifiers 11b at the left side of the memory mat 10b leading to the row of sense amplifiers 11d through the switch unit 12c, the memory mat 10b, the switch unit 12d, the row of sense amplifiers 11c, the switch unit 12e, the memory mat 10c and the switch unit 12f. Then, by transferring data through the second transfer path, data of the row of sense amplifiers 11b as a copy source can be copied to the row of sense amplifiers 11d as a copy destination.

After the data transfers in FIGS. 35 and 36 are completed, data of the rows of sense amplifiers 11d and 11e as the copy destinations are written back into the memory cells MC on the predetermined word line WL of the memory mat 10d. Thereby, one word data is copied from the memory mat 10b to the memory mat 10d. The control of the third embodiment can be performed at a desired timing in normal operation.

In the foregoing, the present invention has been described based on the three embodiments. However, the present invention is not limited to the above described embodiments, and can variously be modified without departing the essentials of the present invention. In the embodiments, the case of applying the present invention to the DRAM has been described. However, the present invention can be widely applied to a logic mixed memory in which a memory having the configuration of the present invention and an operation circuit are provided. Further, in the embodiments, the shared sense amplifier scheme, the ¼ pitch cell array scheme, the ½ pitch cell array scheme, and the various configurations of the row of sense amplifiers 11 or the switch unit 12 are exemplified. However the present invention is not limited to these schemes and configurations, and can be widely applied to various semiconductor memory devices.

Further, in the above described three embodiments, the case has been described in which the transfer path formed between different mats 10 is connected using every two bit lines BL of a plurality of bit lines BL. However the transfer path may be connected to all the bit lines BL. In this case, on/off control for the switch units 12 should be performed based on the state J shown in FIG. 3. By controlling in this manner, the number of the bit lines BL in the transfer path is doubled, while the resistance of the transfer path is reduced to about half, and thereby improving the transfer speed.

The present invention is not limited to the above described embodiments, and various variations and modifications may be possible without departing from the scope of the present invention.

This application is based on the Japanese Patent application No. 2006-217575 filed on Aug. 9, 2006, entire content of which is expressly incorporated by reference herein.

What is claimed is:

1. A semiconductor memory device in which a memory cell array including a plurality of memory cells formed at intersections between a plurality of word lines and a plurality of bit lines, comprising:
   a plurality of unit blocks connected in cascade into which the memory cell array is divided;
   a plurality of rows of sense amplifiers arranged at one end and the other end of the plurality of bit lines in said unit block and each including a plurality of sense amplifiers for amplifying data of the memory cells for each bit line pair;
   first switch means for switching a connection state between said unit block and said row of sense amplifiers attached to said unit block;
   two cache memories for storing two said rows of sense amplifiers attached to one of said unit blocks;
   second switch means for switching a connection state between unshared rows of sense amplifiers attached only to said unit block located at both ends of the memory cell array and said cache memories; and
   control means for controlling said first switch means and said second switch means so as to form a transfer path from said row of sense amplifiers attached to a predetermined said unit block leading to said cache memory using the plurality of bit lines, and for performing a transfer operation of data in said row of sense amplifier to said cache memory through the transfer path.

2. The semiconductor memory device according to claim 1, wherein said control means transfers data in said row of sense amplifiers attached to said unit block to be refreshed, thereafter performs a refresh operation for said unit block to be refreshed using said row of sense amplifiers as a transfer source.

3. The semiconductor memory device according to claim 1, wherein the memory cell array is configured by connecting N (N is an integer larger than or equal to 2) said unit blocks in cascade, and has N−1 said rows of sense amplifiers shared by two adjacent said unit blocks and two unshared said rows of sense amplifiers attached only to said unit blocks located at both ends of the memory cell array,
   and wherein one said cache memory is arranged at one end of the memory cell array and the other said cache memory is arranged at the other end of the memory cell array.

4. The semiconductor memory device according to claim 1, wherein an operation circuit for performing an operation using stored data in said cache memory is attached to each of said cache memories.

5. A semiconductor memory device in which a memory cell array including a plurality of memory cells formed at intersections between a plurality of word lines and a plurality of bit lines, comprising:
   a plurality of unit blocks into which the memory cell array is divided;
   a plurality of rows of sense amplifiers arranged at one end and the other end of the plurality of bit lines in said unit block and each including a plurality of sense amplifiers for amplifying data of the memory cells for each bit line pair;
   switch means for switching a connection state between said unit block and said row of sense amplifiers attached to said unit block; and
   control means for controlling said switch means so as to form a transfer path from said row of sense amplifiers as a transfer source attached to a predetermined said unit block leading to said row of sense amplifiers as a transfer destination not attached to the predetermined said unit block using the plurality of bit lines, and controls so that data of the transfer source is transferred to said row of sense amplifiers as the transfer destination.

6. The semiconductor memory device according to claim 5, wherein said memory cell array is configured using a shared sense amplifier scheme in which adjacent said unit blocks share said row of sense amplifiers arranged therebetween.

* * * * *